(12) United States Patent
Kozicki

(10) Patent No.: US 8,213,217 B2
(45) Date of Patent: Jul. 3, 2012

(54) MICROELECTRONIC PROGRAMMABLE DEVICE AND METHODS OF FORMING AND PROGRAMMING THE SAME

(75) Inventor: Michael N. Kozicki, Phoenix, AZ (US)

(73) Assignee: Axon Technologies Corporation, Scottsdale, AZ (US)

( * ) Notice: Subject to any disclaimer, the term of this patent is extended or adjusted under 35 U.S.C. 154(b) by 0 days.

(21) Appl. No.: 13/090,193

(22) Filed: Apr. 19, 2011

(65) Prior Publication Data

US 2011/0194339 A1 Aug. 11, 2011

Related U.S. Application Data

(60) Continuation of application No. 12/701,060, filed on Feb. 5, 2010, now Pat. No. 7,929,331, which is a continuation of application No. 12/166,261, filed on Jul. 1, 2008, now Pat. No. 7,675,766, which is a continuation of application No. 11/276,097, filed on Feb. 14, 2006, now Pat. No. 7,405,967, which is a continuation of application No. 10/452,041, filed on May 30, 2003, now Pat. No. 6,998,312, which is a division of application No. 09/951,882, filed on Sep. 10, 2001, now Pat. No. 6,635,914, which is a continuation-in-part of application No. 09/502,915, filed on Feb. 11, 2000, now Pat. No. 6,487,106, and a continuation-in-part of application No. 09/555,612, filed on Jul. 27, 2000, now Pat. No. 6,418,049.

(60) Provisional application No. 60/231,427, filed on Sep. 8, 2000, provisional application No. 60/231,432, filed on Sep. 8, 2000, provisional application No. 60/231,343, filed on Sep. 8, 2000, provisional application No. 60/231,345, filed on Sep. 8, 2000, provisional application No. 60/231,346, filed on Sep. 8, 2000, provisional application No. 60/231,350, filed on Sep. 8, 2000, provisional application No. 60/282,045, filed on Apr. 6, 2001, provisional application No. 60/283,591, filed on Apr. 13, 2001, provisional application No. 60/291,886, filed on May 18, 2001.

(51) Int. Cl.
*G11C 11/00* (2006.01)

(52) U.S. Cl. ........ 365/148; 365/100; 365/113; 365/129; 365/163; 977/754; 257/296

(58) Field of Classification Search .............. 365/46, 365/94, 100, 113, 129, 148, 163; 257/2–5, 257/296, E31.047, E27.006; 438/29, 95, 438/96, 166, 259, 365, 482, 486, 597
See application file for complete search history.

(56) References Cited

U.S. PATENT DOCUMENTS

| | | | |
|---|---|---|---|
| 3,679,945 A | 7/1972 | Sekido et al. | |
| 3,761,896 A | 9/1973 | Davidson | |
| 4,203,123 A | 5/1980 | Shanks | |
| 4,945,257 A | 7/1990 | Marrocco, III | |
| 5,153,681 A | 10/1992 | Kishimoto et al. | |
| 5,278,636 A | 1/1994 | Williams | |
| 5,761,110 A | 6/1998 | Irrinki et al. | |
| 6,418,049 B1* | 7/2002 | Kozicki et al. | 365/174 |
| 6,487,106 B1* | 11/2002 | Kozicki | 365/153 |
| 6,635,914 B2* | 10/2003 | Kozicki et al. | 257/296 |
| 6,998,312 B2* | 2/2006 | Kozicki et al. | 438/270 |
| 7,405,967 B2* | 7/2008 | Kozicki et al. | 365/174 |

* cited by examiner

*Primary Examiner* — Richard Elms
*Assistant Examiner* — Harry W Byrne
(74) *Attorney, Agent, or Firm* — Snell & Wilmer, LLP

(57) ABSTRACT

A microelectronic programmable structure and methods of forming and programming the structure are disclosed. The programmable structure generally includes an ion conductor and a plurality of electrodes. Electrical properties of the structure may be altered by applying a bias across the electrodes, and thus information may be stored using the structure.

21 Claims, 13 Drawing Sheets

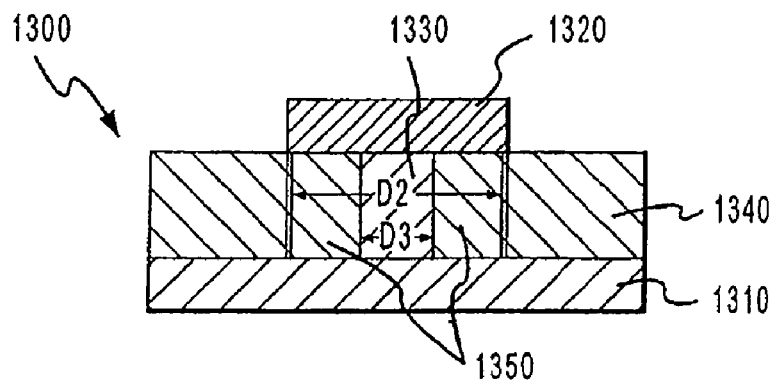
FIG.13
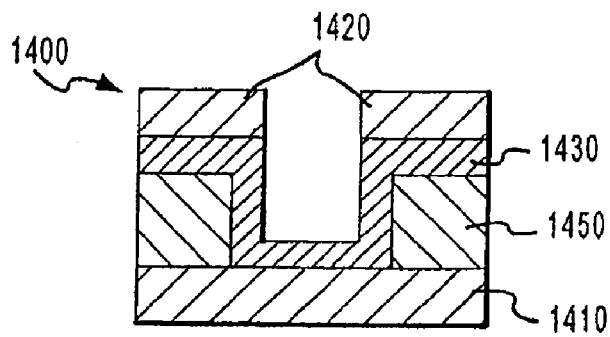
FIG.14
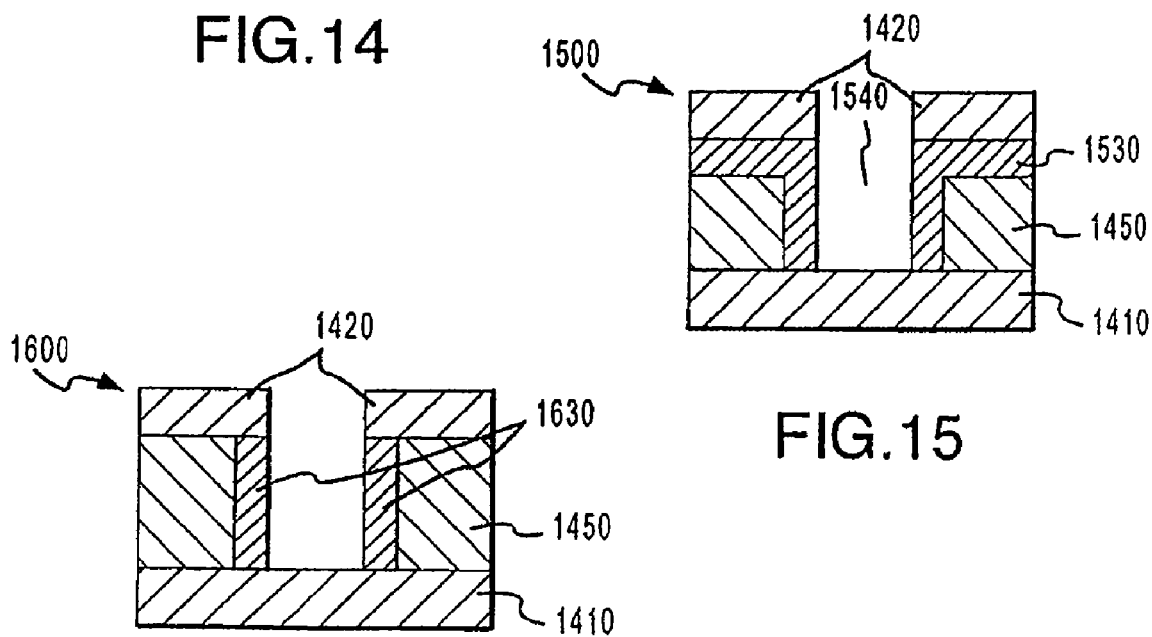
FIG.15
FIG.16

MICROELECTRONIC PROGRAMMABLE DEVICE AND METHODS OF FORMING AND PROGRAMMING THE SAME

CROSS-REFERENCE TO RELATED APPLICATIONS

This application is a continuation of U.S. application Ser. No. 12/701,060 entitled "MICROELECTRONIC PROGRAMMABLE DEVICE AND METHODS OF FORMING AND PROGRAMMING THE SAME," filed Feb. 5, 2010. The '060 application is a continuation of U.S. application Ser. No. 12/166,261 entitled "MICROELECTRONIC PROGRAMMABLE DEVICE AND METHODS OF FORMING AND PROGRAMMING THE SAME," filed Jul. 1, 2008, and which issued as U.S. Pat. No. 7,675,766 on Mar. 9, 2010. The '261 application is a continuation of U.S. application Ser. No. 11/276,097 entitled "MICROELECTRONIC PROGRAMMABLE DEVICE AND METHODS OF FORMING AND PROGRAMMING THE SAME," filed Feb. 14, 2006, and which issued as U.S. Pat. No. 7,405,967 on Jul. 29, 2008. The '097 application is a continuation of U.S. application Ser. No. 10/452,041 entitled "MICROELECTRONIC PROGRAMMABLE DEVICE AND METHODS OF FORMING AND PROGRAMMING THE SAME," filed May 30, 2003, and which issued as U.S. Pat. No. 6,998,312 on Feb. 14, 2006. The '041 application is a divisional of U.S. application Ser. No. 09/951,882 entitled "MICROELECTRONIC PROGRAMMABLE DEVICE AND METHODS OF FORMING AND PRO-GRAMMING THE SAME," filed Sep. 10, 2001, and which issued as U.S. Pat. No. 6,635,914 on Oct. 21, 2003. The '882 is a Continuation-in-Part of U.S. application Ser. No. 09/502,915 entitled "PROGRAMMABLE MICROELECTRONIC DEVICES AND METHODS OF FORMING AND PROGRAMMING SAME," filed Feb. 11, 2000, and which issued as U.S. Pat. No. 6,487,106 on Nov. 26, 2002. The '882 is also a Continuation-in-Part of U.S. application Ser. No. 09/555,612 entitled "PROGRAMMABLE SUBSURFACE AGGREGATING METALLIZATION CELL STRUCTURE AND METHOD OF MAKING SAME," filed Jul. 27, 2000, and which issued as U.S. Pat. No. 6,418,049 on Jul. 9, 2002. The '882 application also claims priority to and the benefit of U.S. Provisional Application Ser. No. 60/231,427 entitled "ELECTRODES FOR THE PROGRAMMABLE METALLIZATION CELL," filed Sep. 8, 2000; U.S. Provisional Application Ser. No. 60/231,432 entitled "PROGRAMMABLE METALLIZATION CELL WITH FLOATING ELECTRODE AND METHOD OF PROGRAMMING AND FORMING THE SAME," filed Sep. 8, 2000; U.S. Provisional Application Ser. No. 60/231,343 entitled "COMMON ELECTRODE CONFIGURATIONS OF THE PROGRAMMABLE METALLIZATION CELL," filed Sep. 8, 2000; U.S. Provisional Application Ser. No. 60/231,345 entitled "GLASS COMPOSITION SUITABLE FOR PROGRAMMABLE METALLIZATION CELLS AND METHOD OF FORMING THE SAME," filed Sep. 8, 2000; U.S. Provisional Application Ser. No. 60/231,346 entitled "SOLID SOLUTION FOR THE PROGRAMMABLE METALLIZATION CELL AND METHOD OF FORMING THE SAME," filed Sep. 8, 2000; U.S. Provisional Application Ser. No. 60/231,350 entitled "ULTRA LOW ENERGY PROGRAMMABLE METALLIZATION CELL DEVICES AND METHODS OF FORMING THE SAME," filed Sep. 8, 2000; U.S. Provisional Application Ser. No. 60/282,045 entitled "INTERNET APPLICANCE USING PROGRAMMABLE METALLIZATION CELL TECHNOLOGY," filed Apr. 6, 2001; U.S. Provisional Application No. 60/283,591 entitled "OPTIMIZED GLASS COMPOSITION FOR THE PROGRAMMABLE METALLIZATION CELL," filed Apr. 13, 2001; and U.S. Provisional Application Ser. No. 60/291,886 entitled "ELECTRODES FOR THE PROGRAMMABLE METALLIZATION CELL," filed May 18, 2001, all of which are incorporated herein by reference.

FIELD OF THE INVENTION

The present invention generally relates to microelectronic devices. More particularly, the invention relates to programmable microelectronic structures suitable for use in integrated circuits.

BACKGROUND OF THE INVENTION

Memory devices are often used in electronic systems and computers to store information in the form of binary data. These memory devices may be characterized into various types, each type having associated with it various advantages and disadvantages.

For example, random access memory ("RAM") which may be found in personal computers is typically volatile semiconductor memory; in other words, the stored data is lost if the power source is disconnected or removed. Dynamic RAM ("DRAM") is particularly volatile in that it must be "refreshed" (i.e., recharged) every few microseconds in order to maintain the stored data. Static RAM ("SRAM") will hold the data after one writing so long as the power source is maintained; once the power source is disconnected, however, the data is lost. Thus, in these volatile memory configurations, information is only retained so long as the power to the system is not turned off. In general, these RAM devices can take up significant chip area and therefore may be expensive to manufacture and consume relatively large amounts of energy for data storage. Accordingly, improved memory devices suitable for use in personal computers and the like are desirable.

Other storage devices such as magnetic storage devices (e.g., floppy disks, hard disks and magnetic tape) as well as other systems, such as optical disks, CD-RW and DVD-RW are non-volatile, have extremely high capacity, and can be rewritten many times. Unfortunately, these memory devices are physically large, are shock/vibration-sensitive, require expensive mechanical drives, and may consume relatively large amounts of power. These negative aspects make such memory devices non-ideal for low power portable applications such as lap-top and palm-top computers, personal digital assistants ("PDAs"), and the like.

Due, at least in part, to a rapidly growing numbers of compact, low-power portable computer systems in which stored information changes regularly, low energy read/write semiconductor memories have become increasingly desirable and widespread. Furthermore, because these portable systems often require data storage when the power is turned off, non-volatile storage device are desired for use in such systems.

One type of programmable semiconductor non-volatile memory device suitable for use in such systems is a programmable read-only memory ("PROM") device. One type of PROM, a write-once read-many ("WORM") device, uses an array of fusible links. Once programmed, the WORM device cannot be reprogrammed.

Other forms of PROM devices include erasable PROM ("EPROM") and electrically erasable PROM (EEPROM) devices, which are alterable after an initial programming.

EPROM devices generally require an erase step involving exposure to ultra violet light prior to programming the device. Thus, such devices are generally not well suited for use in portable electronic devices. EEPROM devices are generally easier to program, but suffer from other deficiencies. In particular, EEPROM devices are relatively complex, are relatively difficult to manufacture, and are relatively large. Furthermore, a circuit including EEPROM devices must withstand the high voltages necessary to program the device. Consequently, EEPROM cost per bit of memory capacity is extremely high compared with other means of data storage. Another disadvantage of EEPROM devices is that, although they can retain data without having the power source connected, they require relatively large amounts of power to program. This power drain can be considerable in a compact portable system powered by a battery.

In view of the various problems associated with conventional data storage devices described above, a relatively non-volatile, programmable device which is relatively simple and inexpensive to produce is desired. Furthermore, this memory technology should meet the requirements of the new generation of portable computer devices by operating at a relatively low voltage while providing high storage density and a low manufacturing cost.

SUMMARY OF THE INVENTION

The present invention provides improved microelectronic devices for use in integrated circuits. More particularly, the invention provides relatively non-volatile, programmable devices suitable for memory and other integrated circuits.

The ways in which the present invention addresses various drawbacks of now-known programmable devices are discussed in greater detail below. However, in general, the present invention provides a programmable device that is relatively easy and inexpensive to manufacture, and which is relatively easy to program.

In accordance with one exemplary embodiment of the present invention, a programmable structure includes an ion conductor and at least two electrodes. The structure is configured such that when a bias is applied across two electrodes, one or more electrical properties of the structure change. In accordance with one aspect of this embodiment, a resistance across the structure changes when a bias is applied across the electrodes. In accordance with other aspects of this embodiment, a capacitance or other electrical property of the structure changes upon application of a bias across the electrodes. One or more of these electrical changes may suitably be detected. Thus, stored information may be retrieved from a circuit including the structure.

In accordance with another exemplary embodiment of the invention, a programmable structure includes an ion conductor, at least two electrodes, and a barrier interposed between at least a portion of one of the electrodes and the ion conductor. In accordance with one aspect of this embodiment the barrier material includes a material configured to reduce diffusion of ions between the ion conductor and at least one electrode. The diffusion barrier may also serve to prevent undesired electrodeposit growth within a portion of the structure. In accordance with another aspect, the barrier material includes an insulating material. Inclusion of an insulating material increases the voltage required to reduce the resistance of the device. In accordance with yet another aspect of this embodiment, the barrier includes material that conducts ions, but which is relatively resistant to the conduction of electrons. Use of such material may reduce undesired plating at an electrode and increase the thermal stability of the device.

In accordance with another exemplary embodiment of the invention, a programmable microelectronic structure is formed on a surface of a substrate by forming a first electrode on the substrate, depositing a layer of ion conductor material over the first electrode, and depositing conductive material onto the ion conductor material. In accordance with one aspect of this embodiment, a solid solution including the ion conductor and excess conductive material is formed by dissolving (e.g., via thermal and/or photodissolution) a portion of the conductive material in the ion conductor. In accordance with a further aspect, only a portion of the conductive material is dissolved, such that a portion of the conductive material remains on a surface of the ion conductor to form an electrode on a surface of the ion conductor material.

In accordance with another embodiment of the present invention, at least a portion of a programmable structure is formed within a through-hole or via in an insulating material. In accordance with one aspect of this embodiment, a first electrode feature is formed on a surface of a substrate, insulating material is deposited onto a surface of the electrode feature, a via is formed within the insulating material, and a portion of the programmable structure is formed within the via. After the via is formed within the insulating material, a portion of the structure within the via is formed by depositing an ion conductive material onto the conductive material, depositing a second electrode material onto the ion conductive material, and, if desired, removing any excess electrode, ion conductor, and/or insulating material. In accordance with another aspect of this embodiment, only the ion conductor is formed within the via. In this case, a first electrode is formed below the insulating material and in contact with the ion conductor and the second electrode is formed above the insulating material and in contact with the ion conductor. The configuration of the via may be changed to alter (e.g., reduce) a contact area between one or more of the electrodes and the ion conductor. Reducing the cross-sectional area of the interface between the ion conductor and the electrode increases the efficiency of the device (change in electrical property per amount of power supplied to the device). In accordance with another aspect of this embodiment, the via may extend through the lower electrode to reduce the interface area between the electrode and the ion conductor. In accordance with yet another aspect of this embodiment, a portion of the ion conductor may be removed from the via or the ion conductor material may be directionally deposited into only a portion of the via to further reduce an interface between an electrode and the ion conductor.

In accordance with another embodiment of the invention, a programmable device may be formed on a surface of a substrate.

In accordance with a further exemplary embodiment of the invention, multiple bits of information are stored in a single programmable structure. In accordance with one aspect of this embodiment, a programmable structure includes a floating electrode interposed between two additional electrodes.

In accordance with yet another embodiment of the invention, multiple programmable devices are coupled together using a common electrode (e.g., a common anode or a common cathode).

In accordance with yet another embodiment of the invention, multiple programmable devices share a common electrode.

In accordance with yet a further exemplary embodiment of the present invention, a capacitance of a programmable structure is altered by causing ions within an ion conductor of the structure to migrate.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

FIGS. 13-19 illustrate programmable device structures with reduced electrode/ion conductor interface surface area in accordance with the present invention;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The present invention generally relates to microelectronic devices. More particularly, the invention relates to programmable structures or devices suitable for various integrated circuit applications.

Figure 1:
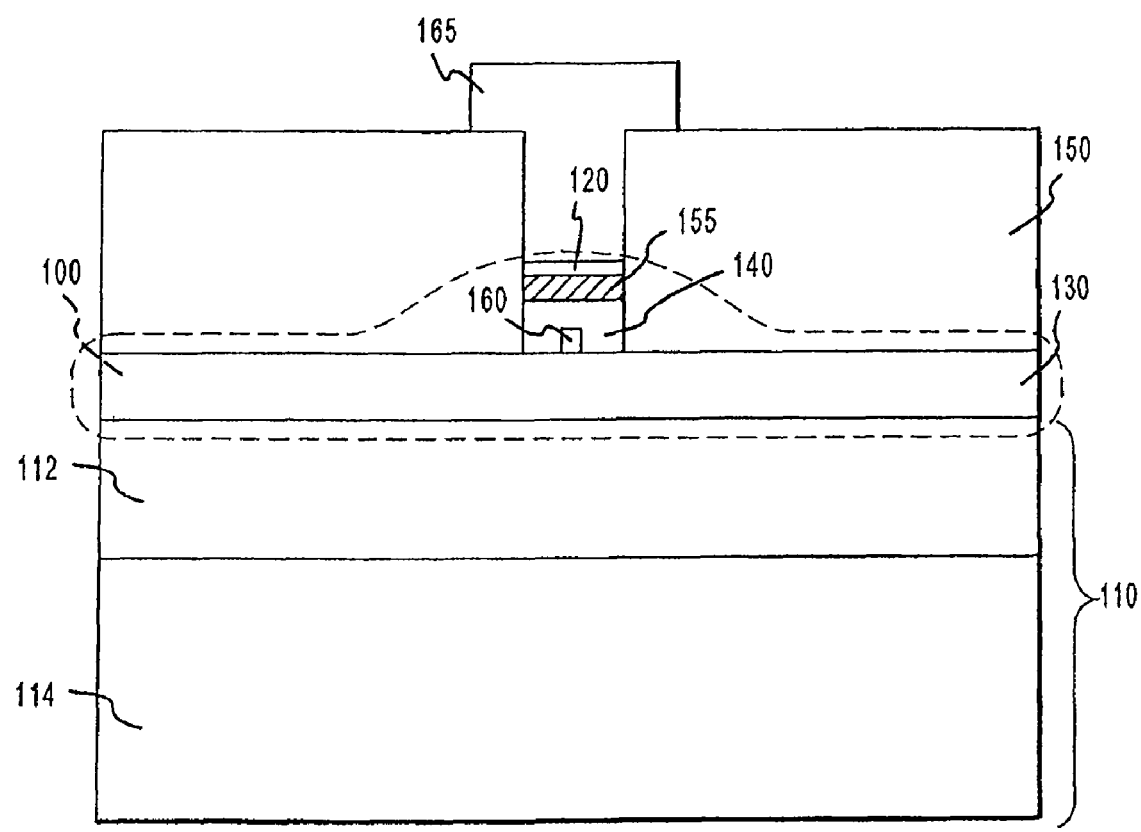
FIG. 1 is a cross-sectional illustration of a programmable structure formed on a surface of a substrate in accordance with the present invention.
Figure 2:
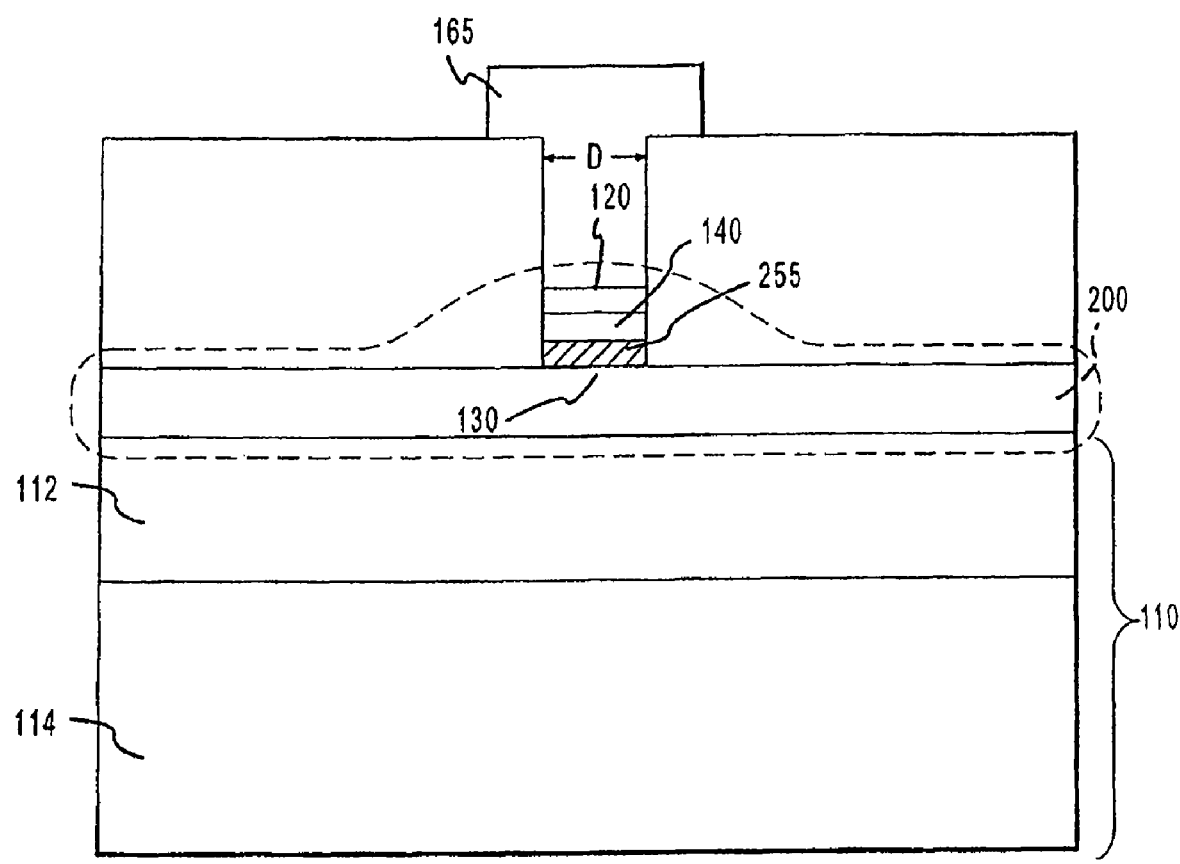
FIG. 2 is a cross-sectional illustration of a programmable structure in accordance with an alternative embodiment of the present invention.

FIGS. 1 and 2 illustrate programmable microelectronic structures 100 and 200 formed on a surface of a substrate 110 in accordance with an exemplary embodiment of the present invention. Structures 100 and 200 include electrodes 120 and 130, an ion conductor 140, and optionally include buffer or barrier layers 155 and/or 255.

Generally, structures 100 and 200 are configured such that when a bias greater than a threshold voltage ($V_T$), discussed in more detail below, is applied across electrodes 120 and 130, the electrical properties of structure 100 change. For example, in accordance with one embodiment of the invention, as a voltage $V \geq V_T$ is applied across electrodes 120 and 130, conductive ions within ion conductor 140 begin to migrate and form an electrodeposit (e.g., electrodeposit 160) at or near the more negative of electrodes 120 and 130; such an electrodeposit, however, is not required to practice the present invention. The term "electrodeposit" as used herein means any area within the ion conductor that has an increased concentration of reduced metal or other conductive material compared to the concentration of such material in the bulk ion conductor material. As the electrodeposit forms, the resistance between electrodes 120 and 130 decreases, and other electrical properties may also change. In the absence of any insulating barriers, which are discussed in more detail below, the threshold voltage required to grow the electrodeposit from one electrode toward the other and thereby significantly reduce the resistance of the device is approximately the redox potential of the system, typically a few hundred millivolts. If the same voltage is applied in reverse, the electrodeposit will dissolve back into the ion conductor and the device will return to a high resistance state. In accordance with other embodiments of the invention, application of an electric field between electrodes 120 and 130 may cause ions dissolved within conductor 140 to migrate and thus cause a change in the electrical properties of device 100, without the formation of an electrodeposit. Structures 100 and 200 may be used to store information and thus may be used in memory circuits. For example, structure 100 or other programmable structures in accordance with the present invention may suitably be used in memory devices to replace DRAM, SRAM, PROM, EPROM, or EEPROM devices. In addition, programmable structures of the present invention may be used for other applications where programming or changing of electrical properties or a portion of an electrical circuit are desired.

Substrate 110 may include any suitable material. For example, substrate 110 may include semiconductive, conductive, semiinsulative, insulative material, or any combination of such materials. In accordance with one embodiment of the invention, substrate 110 includes an insulating material 112 and a portion 114 including microelectronic devices formed on a semiconductor substrate. Layers 112 and 114 may be separated by additional layers (not shown) such as, for example, layers typically used to form integrated circuits. Because the programmable structures can be formed over insulating or other materials, the programmable structures of the present invention are particularly well suited for applications where substrate (e.g., semiconductor material) space is a premium.

Electrodes 120 and 130 may be formed of any suitable conductive material. For example, electrodes 120 and 130 may be formed of doped polysilicon material or metal.

In accordance with one exemplary embodiment of the invention, one of electrodes 120 and 130 is formed of a material including a metal that dissolves in ion conductor 140 when a sufficient bias ($V \geq V_T$) is applied across the electrodes (oxidizable electrode) and the other electrode is relatively inert and does not dissolve during operation of the programmable device (an indifferent electrode). For example, electrode 120 may be an anode during a write process and be comprised of a material including silver that dissolves in ion conductor 140 and electrode 130 may be a cathode during the write process and be comprised of an inert material such as tungsten, nickel, molybdenum, platinum, metal silicides, and the like. Having at least one electrode formed of a material including a metal which dissolves in ion conductor 140 facilitates maintaining a desired dissolved metal concentration within ion conductor 140, which in turn facilitates rapid and stable electrodeposit 160 formation within ion conductor 140 or other electrical property change during use of structure 100 and/or 200. Furthermore, use of an inert material for the other electrode (cathode during a write operation) facilitates electrodissolution of any electrodeposit that may have formed and/or return of the programmable device to an erased state after application of a sufficient voltage.

During an erase operation, dissolution of any electrodeposit that may have formed preferably begins at or near the oxidizable electrode/electrodeposit interface. Initial dissolution of the electrodeposit at the oxidizable electrode/electrodeposit interface may be facilitated by forming structure 100 such that the resistance of the at the oxidizable electrode/electrodeposit interface is greater than the resistance at any other point along the electrodeposit, particularly, the interface between the electrodeposit and the indifferent electrode.

One way to achieve relatively low resistance at the indifferent electrode is to form the electrode of relatively inert, non-oxidizing material such as platinum. Use of such material reduces formation of oxides at the interface between ion conductor 140 and the indifferent electrode as well as the formation of compounds or mixtures of the electrode material and ion conductor 140 material, which typically have a higher resistance than ion conductor 140 or the electrode material.

Relatively low resistance at the indifferent electrode may also be obtained by forming a barrier layer between the oxidizable electrode (anode during a write operation), wherein the barrier layer is formed of material having a relatively high resistance. Exemplary high resistance materials include layers (e.g., layer 155 and/or layer 255) of ion conducting material (e.g., $Ag_xO$, $Ag_xS$, $Ag_xSe$, $Ag_xTe$, where $x \geq 2$, $Ag_yI$, where $x \geq 1$, $CuI_z$, CuO, CuS, CuSe, CuTe, $GeO_2$, or $SiO_2$) interposed between ion conductor 140 and a metal layer such as silver. Some of these materials have additional benefits as discussed in more detail below.

Reliable growth and dissolution of an electrodeposit can also be facilitated by providing a roughened indifferent electrode surface (e.g., a root mean square roughness of greater than about 1 nm) at the electrode/ion conductor interface. The roughened surface may be formed by manipulating film deposition parameters and/or by etching a portion of one of the electrode of ion conductor surfaces. During a write operation, relatively high electrical fields form about the spikes or peaks of the roughened surface, and thus the electrodeposits are more likely to form about the spikes or peaks. As a result, more reliable and uniform changes in electrical properties for an applied voltage across electrodes 120 and 130 may be obtained by providing a roughed interface between the indifferent electrode (cathode during a write operation) and ion conductor 140.

Oxidizable electrode material may have a tendency to thermally dissolve or diffuse into ion conductor 140, particularly during fabrication and/or operation of structure 100. The thermal diffusion is undesired because it may reduce the resistance of structure 100 and thus reduce the change of an electrical property during use of structure 100.

To reduce undesired diffusion of oxidizable electrode material into ion conductor 140 and in accordance with another embodiment of the invention, the oxidizable electrode includes a metal intercalated in a transition metal sulfide or selenide material such as $A_x(MB_2)_{1-x}$, where A is Ag or Cu, B is S or Se, M is a transition metal such as Ta, V, and Ti, and x ranges from about 0.1 to about 0.7. The intercalated material mitigates undesired thermal diffusion of the metal (Ag or Cu) into the ion conductor material, while allowing the metal to participate in the electrodeposit growth upon application of a sufficient voltage across electrodes 120 and 130. For example, when silver is intercalated into a $TaS_2$ film, the $TaS_2$ film can include up to about 66.8 atomic percent silver. The $A_x(MB_2)_{1-x}$ material is preferably amorphous to prevent to prevent undesired diffusion of the metal though the material. The amorphous material may be formed by, for example, physical vapor deposition of a target material comprising $A_x(MB_2)_{1-x}$.

α-AgI is another suitable material for the oxidizable electrode, as well as the indifferent electrode. Similar to the $A_x(MB_2)_{1-x}$ material discussed above, α-AgI can serve as a source of Ag during operation of structure 100—e.g., upon application of a sufficient bias, but the silver in the AgI material does not readily thermally diffuse into ion conductor 140. AgI has a relatively low activation energy for conduction of electricity and does not require doping to achieve relatively high conductivity. When the oxidizable electrode is formed of AgI, depletion of silver in the AgI layer may arise during operation of structure 100, unless excess silver is provided to the electrode. One way to provide the excess silver is to form a silver layer adjacent the AgI layer as discussed above when AgI is used as a buffer layer. The AgI layer (e.g., layer 155 and/or 255) reduces thermal diffusion of Ag into ion conductor 140, but does not significantly affect conduction of Ag during operation of structure 100. In addition, use of AgI increases the operational efficiency of structure 100 because the AgI mitigates non-Faradaic conduction (conduction of electrons that do not participate in the electrochemical reaction).

Other materials suitable for buffer layers 155 and/or 255 include $GeO_2$ and $SiO_x$. Amorphous $GeO_2$ is relatively porous an will "soak up" silver during operation of device 100, but will retard the thermal diffusion of silver to ion conductor 140, compared to structures or devices that do not include a buffer layer. When ion conductor 140 includes germanium, $GeO_2$ may be formed by exposing ion conductor 140 to an oxidizing environment at a temperature of about 300° C. to about 800° C. or by exposing ion conductor 140 to an oxidizing environment in the presence of radiation having an energy greater than the band gap of the ion conductor material. The $GeO_2$ may also be deposited using physical vapor deposition (from a $GeO_2$ target) or chemical vapor deposition (from $GeH_4$ and an $O_2$).

Buffer layers can also be used to increase a "write voltage" by placing the buffer layer (e.g., $GeO_2$ or $SiO_x$) between ion conductor 140 and the indifferent electrode. The buffer material allows metal such as silver to diffuse though the buffer and take part in the electrochemical reaction.

In accordance with one embodiment of the invention, at least one electrode 120 and 130 is formed of material suitable for use as an interconnect metal. For example, electrode 130 may form part of an interconnect structure within a semiconductor integrated circuit. In accordance with one aspect of this embodiment, electrode 130 is formed of a material that is substantially insoluble in material comprising ion conductor 140. Exemplary materials suitable for both interconnect and electrode 130 material include metals and compounds such as tungsten, nickel, molybdenum, platinum, metal silicides, and the like.

Layers 155 and/or 255 may also include a material that restricts migration of ions between conductor 140 and the electrodes. In accordance with exemplary embodiments of the invention, a barrier layer includes conducting material such as titanium nitride, titanium tungsten, a combination thereof, or the like. The barrier may be electrically indifferent, i.e., it allows conduction of electrons through structure 100 or 200, but it does not itself contribute ions to conduction through structure 200. An electrically indifferent barrier may reduce undesired dendrite growth during operation of the programmable device, and thus may facilitate an "erase" or dissolution of electrodeposit 160 when a bias is applied which is opposite to that used to grow the electrodeposit. In addition, use of a conducting barrier allows for the "indifferent" electrode to be formed of oxidizable material because the barrier prevents diffusion of the electrode material to the ion conductor.

Ion conductor 140 is formed of material that conducts ions upon application of a sufficient voltage. Suitable materials for ion conductor 140 include glasses and semiconductor materials. In one exemplary embodiment of the invention, ion conductor 140 is formed of chalcogenide material.

Ion conductor 140 may also suitably include dissolved conductive material. For example, ion conductor 140 may comprise a solid solution that includes dissolved metals and/or metal ions. In accordance with one exemplary embodiment of the invention, conductor 140 includes metal and/or metal ions dissolved in chalcogenide glass. An exemplary chalcogenide glass with dissolved metal in accordance with the present invention includes a solid solution of $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, where x ranges from about 0.1 to about 0.5 other chalcogenide materials including silver, copper, zinc, combinations of these materials, and the like. In addition, conductor 140 may include network modifiers that affects mobility of ions through conductor 140. For example, materials such as metals (e.g., silver), halogens, halides, or hydrogen may be added to conductor 140 to enhance ion mobility and thus increase erase/write speeds of the structure.

A solid solution suitable for use as ion conductor 140 may be formed in a variety of ways. For example, the solid solution may be formed by depositing a layer of conductive material such as metal over an ion conductive material such as chalcogenide glass and exposing the metal and glass to thermal and/or photo dissolution processing. In accordance with one exemplary embodiment of the invention, a solid solution of $As_2S_3$—Ag is formed by depositing $As_2S_3$ onto a substrate, depositing a thin film of Ag onto the $As_2S_3$, and exposing the films to light having energy greater than the optical gap of the $As_2S_3$,—e.g., light having a wavelength of less than about 500 nanometers. If desired, network modifiers may be added to conductor 140 during deposition of conductor 140 (e.g., the modifier is in the deposited material or present during conductor 140 material deposition) or after conductor 140 material is deposited (e.g., by exposing conductor 140 to an atmosphere including the network modifier).

In accordance with another embodiment of the invention, a solid solution may be formed by depositing one of the constituents onto a substrate or another material layer and reacting the first constituent with a second constituent. For example, germanium (preferably amorphous) may be deposited onto a portion of a substrate and the germanium may be reacted with $H_2Se$ to form a Ge—Se glass. Similarly, As can be deposited and reacted with the $H_2Se$ gas, or arsenic or germanium can be deposited and reacted with $H_2S$ gas. Silver or other metal can then be added to the glass as described above.

In accordance with one aspect of this embodiment, a solid solution ion conductor 140 is formed by depositing sufficient metal onto an ion conductor material such that a portion of the metal can be dissolved within the ion conductor material and a portion of the metal remains on a surface of the ion conductor to form an electrode (e.g., electrode 120). In accordance with alternative embodiments of the invention, solid solutions containing dissolved metals may be directly deposited onto substrate 110 and the electrode then formed overlying the ion conductor.

An amount of conductive material such as metal dissolved in an ion conducting material such as chalcogenide may depend on several factors such as an amount of metal available for dissolution and an amount of energy applied during the dissolution process. However, when a sufficient amount of metal and energy are available for dissolution in chalcogenide material using photodissolution, the dissolution process is thought to be self limiting, substantially halting when the metal cations have been reduced to their lowest oxidation state. In the case of $As_2S_3$—Ag, this occurs at $Ag_4As_2S_3=2Ag_2S+As_2S$, having a silver concentration of about 44 atomic percent. If, on the other hand, the metal is dissolved in the chalcogenide material using thermal dissolution, a higher atomic percentage of metal in the solid solution may be obtained, provided a sufficient amount of metal is available for dissolution.

In accordance with a further embodiment of the invention, the solid solution is formed by photodissolution to form a macrohomogeneous ternary compound and additional metal is added to the solution using thermal diffusion (e.g., in an inert environment at a temperature of about 85° C. to about 150° C.) to form a solid solution containing, for example, about 30 to about 50, and preferably about 34 atomic percent silver. Ion conductors having a metal concentration above the photodissolution solubility level facilitates formation of electrodeposits that are thermally stable at operating temperatures (typically about 85° C. to about 150° C.) of devices 100 and 200. Alternatively, the solid solution may be formed by thermally dissolving the metal into the ion conductor at the temperature noted above; however, solid solutions formed exclusively from photodissolution are thought to be less homogeneous than films having similar metal concentrations formed using photodissolution and thermal dissolution.

Ion conductor 140 may also include a filler material, which fills interstices or voids. Suitable filler materials include non-oxidizable and non-silver based materials such as a non-conducting, immiscible silicon oxide and/or silicon nitride, having a cross-sectional dimension of less than about 1 nm, which do not contribute to the growth of an electrodeposit. In this case, the filler material is present in the ion conductor at a volume percent of up to about 5 percent to reduce a likelihood that an electrodeposit will spontaneously dissolve into the supporting ternary material as the device is exposed to elevated temperature, which leads to more stable device operation without compromising the performance of the device. Ion conductor 140 may also include filler material to reduce an effective cross-sectional area of the ion conductor. In this case, the concentration of the filler material, which may be the same filler material described above but having a cross-sectional dimension up to about 50 nm, is present in the ion conductor material at a concentration of up to about 50 percent by volume. The filler material may also include metal such as silver or copper to fill the voids in the ion conductor material.

In accordance with one exemplary embodiment of the invention, ion conductor 140 includes a germanium-selenide glass with silver diffused in the glass. Germanium selenide materials are typically formed from selenium and $Ge(Se)_{4/2}$ tetrahedra that may combine in a variety of ways. In a Se-rich region, Ge is 4-fold coordinated and Se is 2-fold coordinated, which means that a glass composition near $Ge_{0.20}Se_{0.80}$ will have a mean coordination number of about 2.4. Glass with this coordination number is considered by constraint counting theory to be optimally constrained and hence very stable with respect to devitrification. The network in such a glass is known to self-organize and become stress-free, making it easy for any additive, e.g., silver, to finely disperse and form a mixed-glass solid solution. Accordingly, in accordance with one embodiment of the invention, ion conductor 140 includes a glass having a composition of $Ge_{0.17}Se_{0.83}$ to $Ge_{0.25}Se_{0.75}$.

The composition and structure of ion conductor 140 material often depends on the starting or target material used to form the conductor. Generally, it is desired to form a homogenous material layer for conductor 140 to facilitate reliable and repeatable device performance. In accordance with one embodiment of the invention, a target for physical vapor deposition of material suitable for ion conductor 140 is formed by selecting a proper ampoule, preparing the ampoule, maintaining proper temperatures during formation of the glass, slow rocking the composition, and quenching the composition.

Volume and wall thickness are important factors for consideration in selecting an ampoule for forming glass. The wall thickness must be thick enough to withstand gas pressures that arise during the glass formation process and are preferably thin enough to facilitate heat exchange during the formation process. In accordance with exemplary embodiment of the invention, quartz ampoules with a wall thickness of about 1 mm are used to form Se and Te based chalcogenide glasses, whereas quartz ampoules with a wall thickness of about 1.5 mm are used to form sulfur-based chalcogenide glasses. In addition, the volume of the ampoule is preferably selected such that the volume of the ampoule is about five times greater than the liquid glass precursor material.

Once the ampoule is selected, the ampoule is prepared for glass formation, in accordance with one embodiment of the invention, by cleaning the ampoule with hydrofluoric acid, ethanol and acetone, drying the ampoule for at least 24 hours at about 120° C., evacuating the ampoule and heating the ampoule until the ampoule turns a cherry red color and cooling the ampoule under vacuum, filling ampoule with charge and evacuating the ampoule, heating the ampoule while avoiding melting of the constituents to desorb any remaining oxygen, and sealing the ampoule. This process reduces oxygen contamination, which in turn promotes macrohomogeneous growth of the glass.

The melting temperature of the glass formation process depends on the glass material. In the case of germanium-based glasses, sufficient time for the chalcogen to react at low temperature with all available germanium is desired to avoid explosion at subsequent elevated temperatures (the vapor pressure of Se at 920° C. is 10 ATM. and 20 ATM. for S at 720° C.). To reduce the risk of explosion, the glass formation process begins by ramping the ampoule temperature to about 300° C. for selenium-based glasses (about 200° C. for sulfur-based glasses) over the period of about an hour and maintaining this temperature for about 12 hours. Next, the temperature is elevated slowly (about 0.5° C./min) up to a temperature about 50° C. higher than the liquidus temperature of the material and the ampoule remains at about this temperature for about 12 hours. The temperature is then elevated to about 940° C. to ensure melting of all non-reacted germanium for Se-based glasses or about 700° C. for S-based glasses. The ampoule should remain at this elevated temperature for about 24 hours.

The melted glass composition is preferably slow rocked at a rate of about 20/minute at least about six hours to increase the homogeneity of the glass.

Quenching is preferably performed from a temperature at which the vapors and the liquid are in an equilibrium to produce vitrification of the desired composition. In this case, the quenching temperature is about 50° C. over the liquidus temperature of the glass material. Chalcogenide-rich glasses include a range of concentrations in which under-constrained and over-constrained glasses exist. In cases where the glass composition coordinated number is far from the optimal coordination (e.g., coordination numbers of about 2.4 for Ge—Se systems) the quenching rate has to be fast enough in order to ensure vitrification, e.g., quenching in ice-water or an even stronger coolant such as a mixture of urea and ice-water. In the case of optimally coordinated glasses, quenching can be performed in air at about 25° C.

In accordance with one exemplary embodiment of the invention, at least a portion of structure 100 is formed within a via of an insulating material 150. Forming a portion of structure 100 within a via of an insulating material 150 may be desirable because, among other reasons, such formation allows relatively small structures, e.g., on the order of 10 nanometers, to be formed. In addition, insulating material 150 facilitates isolating various structures 100 from other electrical components.

Insulating material 150 suitably includes material that prevents undesired diffusion of electrons and/or ions from structure 100. In accordance with one embodiment of the invention, material 150 includes silicon nitride, silicon oxynitride, polymeric materials such as polyimide or parylene, or any combination thereof.

A contact 165 may suitably be electrically coupled to one or more electrodes 120,130 to facilitate forming electrical contact to the respective electrode. Contact 165 may be formed of any conductive material and is preferably formed of a metal such as aluminum, aluminum alloys, tungsten, or copper.

In accordance with one embodiment of the invention, structure 100 is formed by forming electrode 130 on substrate 110. Electrode 130 may be formed using any suitable method such as, for example, depositing a layer of electrode 130 material, patterning the electrode material, and etching the material to form electrode 130. Insulating layer 150 may be formed by depositing insulating material onto electrode 130 and substrate 110 and forming vias in the insulating material using appropriate patterning and etching processes. Ion conductor 140 and electrode 120 may then be formed within insulating layer 150 by depositing ion conductor 140 material and electrode 120 material within the via. Such ion conductor and electrode material deposition may be selective—i.e., the material is substantially deposited only within the via, or the deposition processes may be relatively non-selective. If one or more non-selective deposition methods are used, any excess material remaining on a surface of insulating layer 150 may be removed using, for example, chemical mechanical polishing and/or etching techniques. Barrier layers 155 and/or 255 may similarly be formed using any suitable deposition and/or etch processes.

Information may be stored using programmable structures of the present invention by manipulating one or more electrical properties of the structures. For example, a resistance of a structure may be changed from a "0" or off state to a "1" or on state during a suitable write operation. Similarly, the device may be changed from a "1" state to a "0" state during an erase operation. In addition, as discussed in more detail below, the structure may have multiple programmable states such that multiple bits of information are stored in a single structure.

Write Operation

Figure 3:
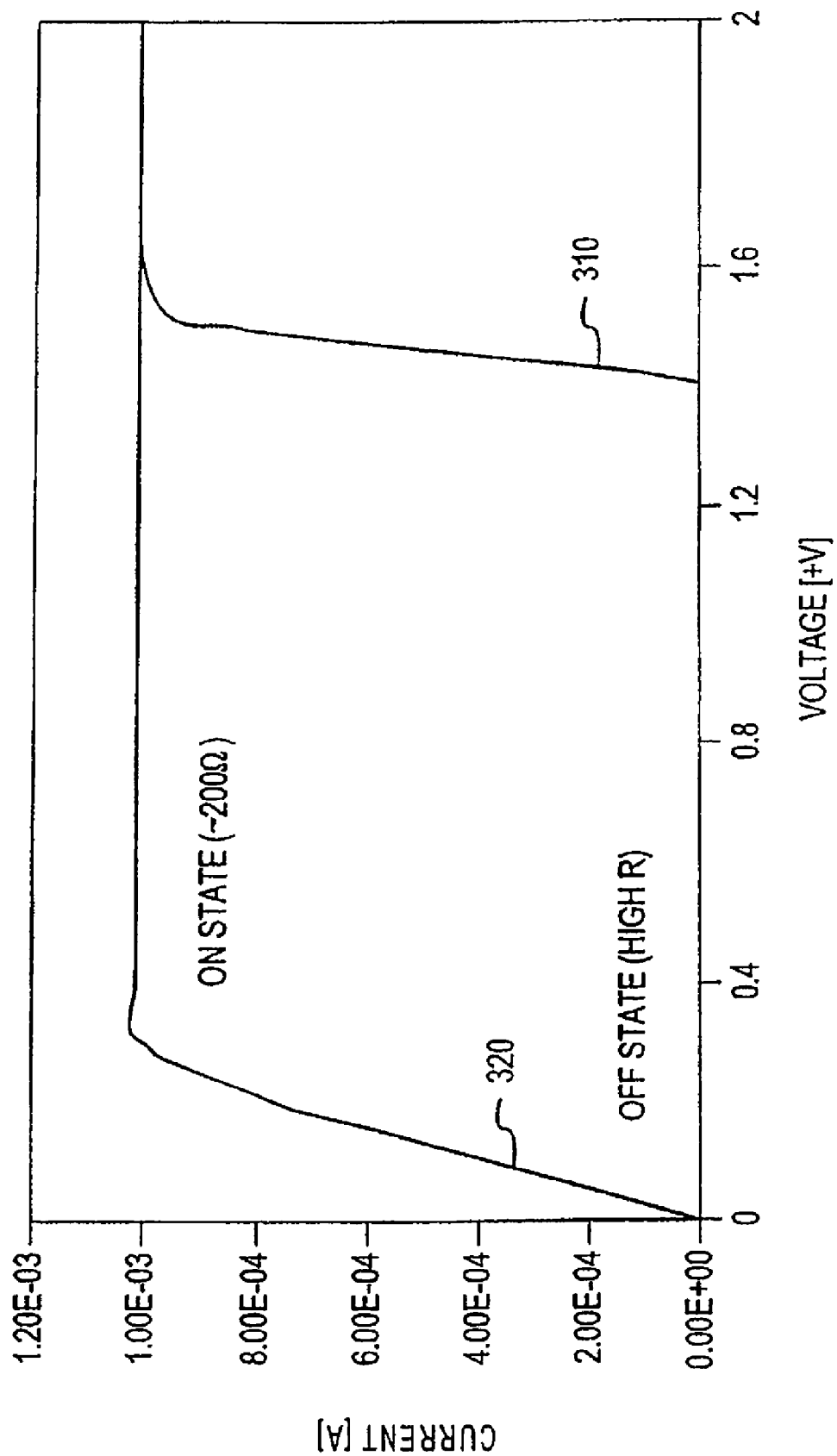
FIG. 3 is a current-voltage diagram illustrating current and voltage characteristics of the device illustrated in FIG. 2 in an "on" and "off" state.

FIG. 3 illustrates current-voltage characteristics of a programmable structure (e.g. structure 200) in accordance with the present invention. In the illustrated embodiment, via diameter, D, is about 4 microns, conductor 140 is about 35 nanometers thick and formed of $Ge_3Se_7$—Ag (near $As_8Ge_3Se_7$), electrode 130 is indifferent and formed of nickel, electrode 120 is formed of silver, and barrier 255 is a native nickel oxide. As illustrated in FIG. 3, current through structure 200 in an off state (curve 310) begins to rise upon application of a bias of over about one volt; however, once a write step has been performed (i.e., an electrodeposit has formed), the resistance through conductor 140 drops significantly (i.e., to about 200 ohms), illustrated by curve 320 in FIG. 3. As noted above, when electrode 130 is coupled to a more negative end of a voltage supply, compared to electrode 120, an electrodeposit begins to form near electrode 130 and grow toward electrode 120. An effective threshold voltage (i.e., voltage required to cause growth of the electrodeposit and to break through barrier 255, thereby coupling electrodes 320, 330 together is relatively high because of barrier 255. In particular, a voltage $V \geq VT$ must be applied to structure 200 sufficient to cause electrons to tunnel through barrier 255 (when barrier 255 comprises an insulating layer) to form the electrodeposit and to overcome the barrier (e.g., by tunneling through or leakage) and conduct through conductor 140 and at least a portion of barrier 255.

In accordance with alternate embodiments of the invention, where no insolating barrier layer is present, an initial "write" threshold voltage is relatively low because no insulative barrier is formed between, for example, ion conductor 140 and either of the electrodes 120, 130.

Read Operation

A state of the device (e.g., 1 or 0) may be read, without significantly disturbing the state, by, for example, applying a forward or reverse bias of magnitude less than a voltage threshold (about 1.4 V for a structure illustrated in FIG. 3) for electrodeposition or by using a current limit which is less than or equal to the minimum programming current (the current which will produce the highest of the on resistance values). A current limited (to about 1 milliamp) read operation is shown in FIG. 3. In this case, the voltage is swept from 0 to about 2 V and the current rises up to the set limit (from 0 to 0.2 V), indicating a low resistance (ohmic/linear current-voltage) "on" state. Another way of performing a non-disturb read operation is to apply a pulse, with a relatively short duration, which may have a voltage higher than the electrochemical deposition threshold voltage such that no appreciable Faradaic current flows, i.e., nearly all the current goes to polarizing/charging the device and not into the electrodeposition process.

Erase Operation

A programmable structure (e.g., structure 200) may suitably be erased by reversing a bias applied during a write operation, wherein a magnitude of the applied bias is equal to or greater than the threshold voltage for electrodeposition in the reverse direction. In accordance with an exemplary embodiment of the invention, a sufficient erase voltage $(V \geq V_T)$ is applied to structure 200 for a period of time which depends on the strength of the initial connection but is typically less than about 1 millisecond to return structure 200 to its "off" state having a resistance well in excess of a million ohms. In cases where the programmable structure does not include a barrier between conductor 140 and electrode 120, a threshold voltage for erasing the structure is much lower than a threshold voltage for writing the structure because, unlike the write operation, the erase operation does not require electron tunneling through a barrier or barrier breakdown.

Control of Operational Parameters

The concentration of conductive material in the ion conductor can be controlled by applying a bias across the programmable device. For example, metal such as silver may be taken out of solution by applying a negative voltage in excess of the reduction potential of the conductive material. Conversely, conductive material may be added to the ion conductor (from one of the electrodes) by applying a bias in excess of the oxidation potential of the material. Thus, for example, if the conductive material concentration is above that desired for a particular device application, the concentration can be reduced by reverse biasing the device to reduce the concentration of the conductive material. Similarly, metal may be added to the solution from the oxidizable electrode by applying a sufficient forward bias. Additionally, it is possible to remove excess metal build up at the indifferent electrode by applying a reverse bias for an extended time or an extended bias over that required to erase the device under normal operating conditions. Control of the conductive material may be accomplished automatically using a suitable microprocessor.

This technique may also be used to form one of the electrodes from material within the ion conductor material. For example, silver from the ion conductor may be plated out to form the oxidizable electrode. This allows the oxidizable electrode to be formed after the device is fully formed and thus mitigates problems associated with conductive material diffusing from the oxidizable electrode during manufacturing of the device.

As noted above, in accordance with yet another embodiment of the invention, multiple bits of data may be stored within a single programmable structure by controlling an amount of electrodeposit which is formed during a write process. An amount of electrodeposit that forms during a write process depends on a number of coulombs or charge supplied to the structure during the write process, and may be controlled by using a current limit power source. In this case, a resistance of a programmable structure is governed by Equation 1, where $R_{on}$ is the "on" state resistance, $V_T$ is the threshold voltage for electrodeposition, and $I_{LIM}$ is the maximum current allowed to flow during the write operation.

$$R_{on} = \frac{V_T}{I_{LIM}} \qquad \text{Equation 1}$$

In practice, the limitation to the amount of information stored in each cell will depend on how stable each of the resistance states is with time. For example, if a structure is with a programmed resistance range of about 3.5 kΩ and a resistance drift over a specified time for each state is about ±250Ω, about 7 equally sized bands of resistance (7 states) could be formed, allowing 3 bits of data to be stored within a single structure. In the limit, for near zero drift in resistance in a specified time limit, information could be stored as a continuum of states, i.e., in analog form.

Figure 4:
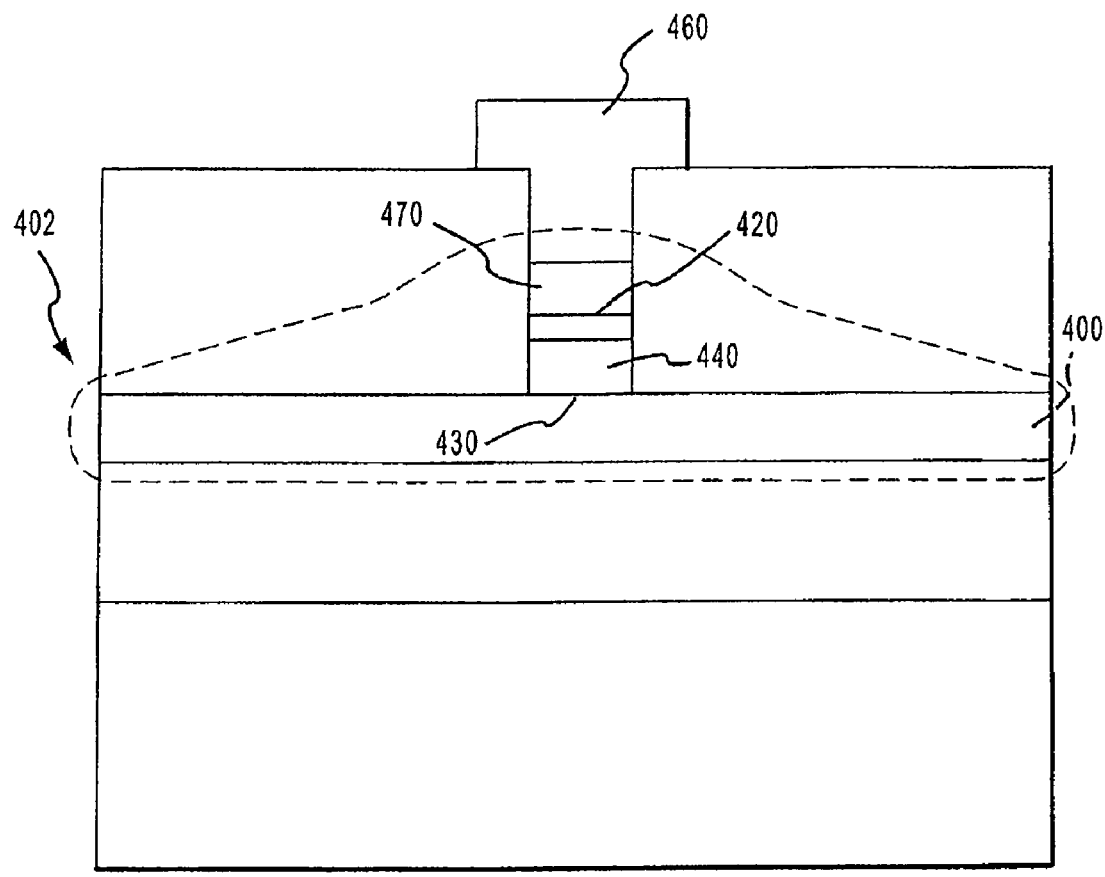
FIG. 4 is a cross-sectional illustration of a programmable structure in accordance with yet another embodiment of the present invention.

A portion of an integrated circuit 402, including a programmable structure 400, configured to provide additional isolation from electronic components is illustrated in FIG. 4. In accordance with an exemplary embodiment of the present invention, structure 400 includes electrodes 420 and 430, an ion conductor 440, a contact 460, and an amorphous silicon diode 470, such as a Schottky or p-n junction diode, formed between contact 460 and electrode 420. Rows and columns of programmable structures 400 may be fabricated into a high density configuration to provide extremely large storage densities suitable for memory circuits. In general, the maximum storage density of memory devices is limited by the size and complexity of the column and row decoder circuitry. However, a programmable structure storage stack can be suitably fabricated overlying an integrated circuit with the entire semiconductor chip area dedicated to row/column decode, sense amplifiers, and data management circuitry (not shown) since structure 400 need not use any substrate real estate. In this manner, storage densities of many gigabits per square centimeter can be attained using programmable structures of the present invention. Utilized in this manner, the programmable structure is essentially an additive technology that adds capability and functionality to existing semiconductor integrated circuit technology.

Figure 5:
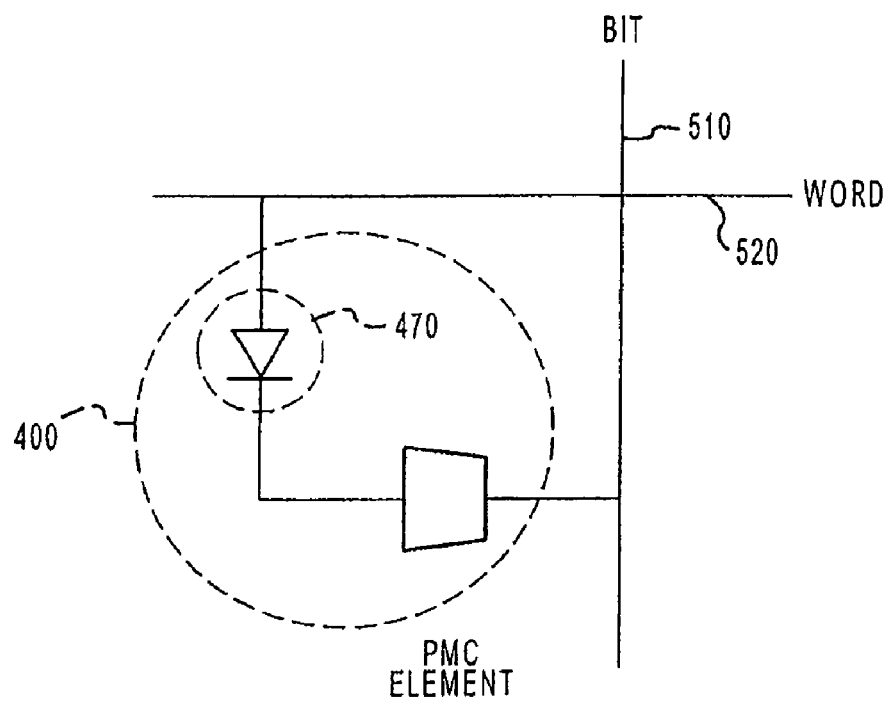
FIG. 5 is a schematic illustration of a portion of a memory device in accordance with an exemplary embodiment of the present invention.
Figure 6:
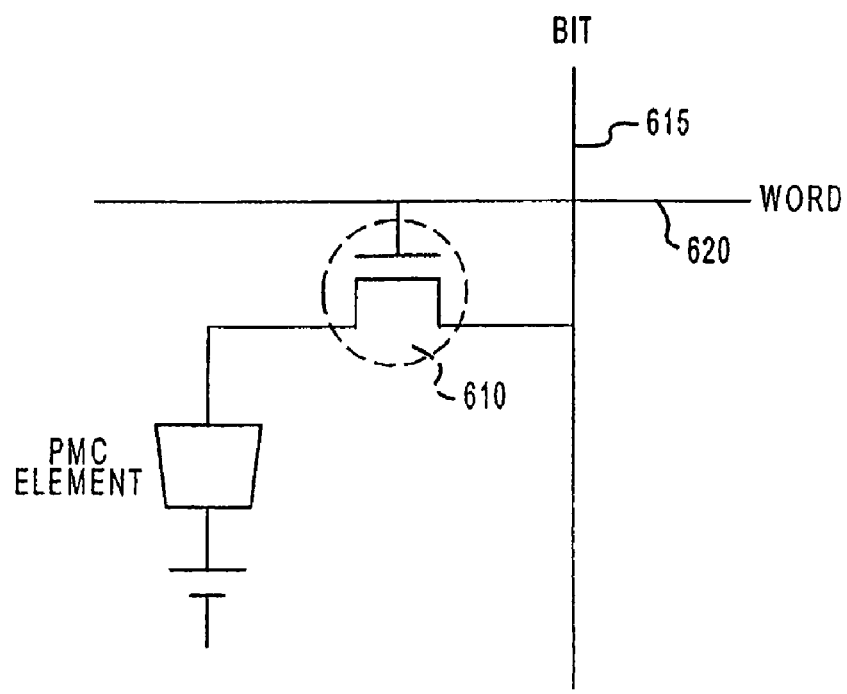
FIG. 6 is a schematic illustration of a portion of a memory device in accordance with an alternative embodiment of the present invention.

FIG. 5 schematically illustrates a portion of a memory device including structure 400 having an isolating p-n junction 470 at an intersection of a bit line 510 and a word line 520 of a memory circuit. FIG. 6 illustrates an alternative isolation scheme employing a transistor 610 interposed between an electrode and a contact of a programmable structure located at an intersection of a bit line 610 and a word line 620 of a memory device.

FIGS. 7-10 illustrate programmable devices in accordance with another embodiment of the invention. The devices illustrated in FIGS. 7-10 have an electrode (e.g., the cathode during a write process) with a smaller cross sectional area in contact with the ion conductor compared to the devices illustrated in FIGS. 1-2 and 4. The smaller electrode interface area is thought to increase the efficiency and endurance of the device because an increased percentage of ions in the solid solution are able to take part in the electrodeposit formation process. Thus any cathode plating from ions that do not participate in the electrodeposit process is reduced.

Figure 7:
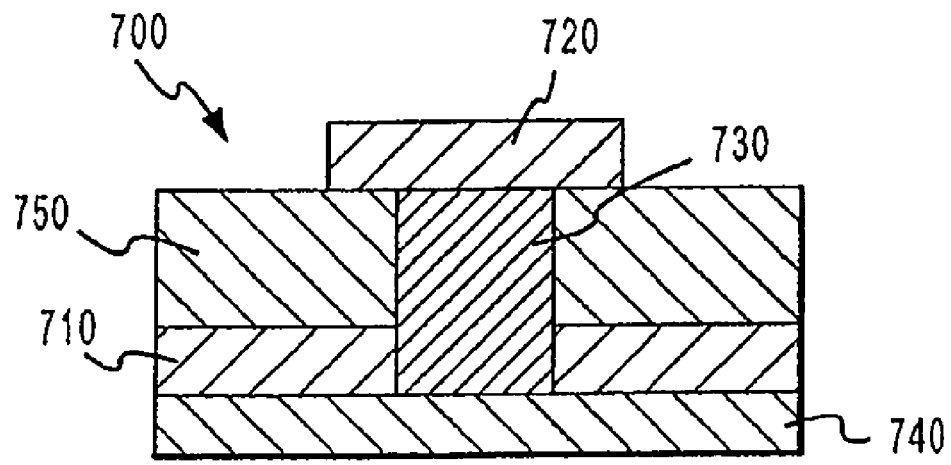
FIGS. 7 and 8 are a cross-sectional illustrations of a programmable structure having an ion conductor/electrode contact interface formed about a perimeter of the ion conductor in accordance with another embodiment of the present invention.
Figure 8:
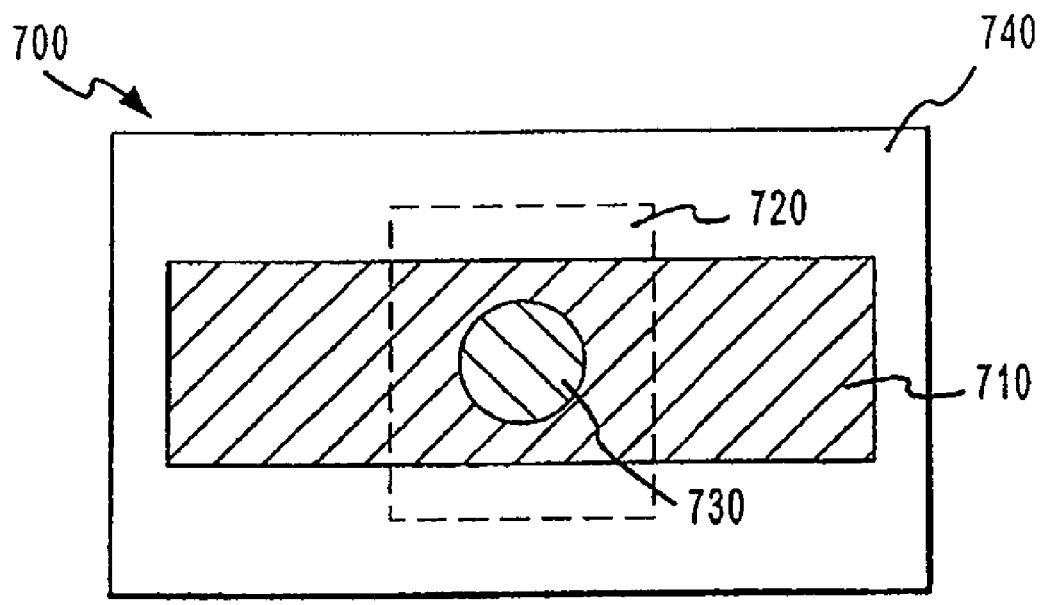

FIGS. 7 and 8 illustrate a cross sectional and a top cut-away view of a programmable device 700 including an indifferent electrode 710, an oxidizable electrode 720, and an ion conductor 730 former overlying an insulating layer 740 such as silicon oxide, silicon nitride, or the like.

Structure 700 is formed by depositing an indifferent electrode material layer and an insulating layer 750 overlying insulating layer 740. A via is then formed through layer 750 and electrode material layer 710, using an anisotropic etch process (e.g., reactive ion etching or ion milling) such that the via extends to and/or through a portion of layer 740. The via is then filled with ion conductor material and is suitably doped to form a solid solution as described herein. Any excess ion conductor material is removed from the surface of layer 750 and electrode 730 is formed, for example using a deposition and etch process. In this case, the indifferent electrode (cathode during write process) area in contact with ion conductor 730 is the surface area of electrode 710 about the perimeter of conductor 730, rather than the area underlying the ion conductor, as illustrated in FIGS. 1-2 and 4.

Figure 9:
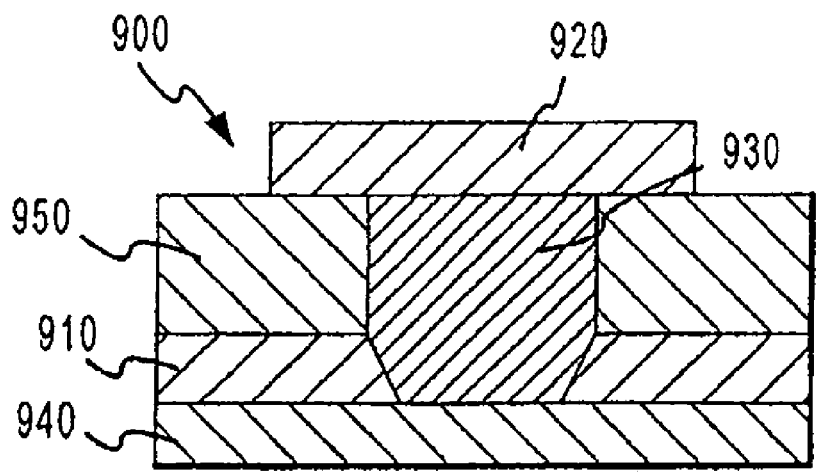
FIGS. 9 and 10 are a cross-sectional illustrations of a programmable structure having an ion conductor/electrode contact interface formed about a perimeter of the ion conductor in accordance with yet another embodiment of the present invention.
Figure 10:
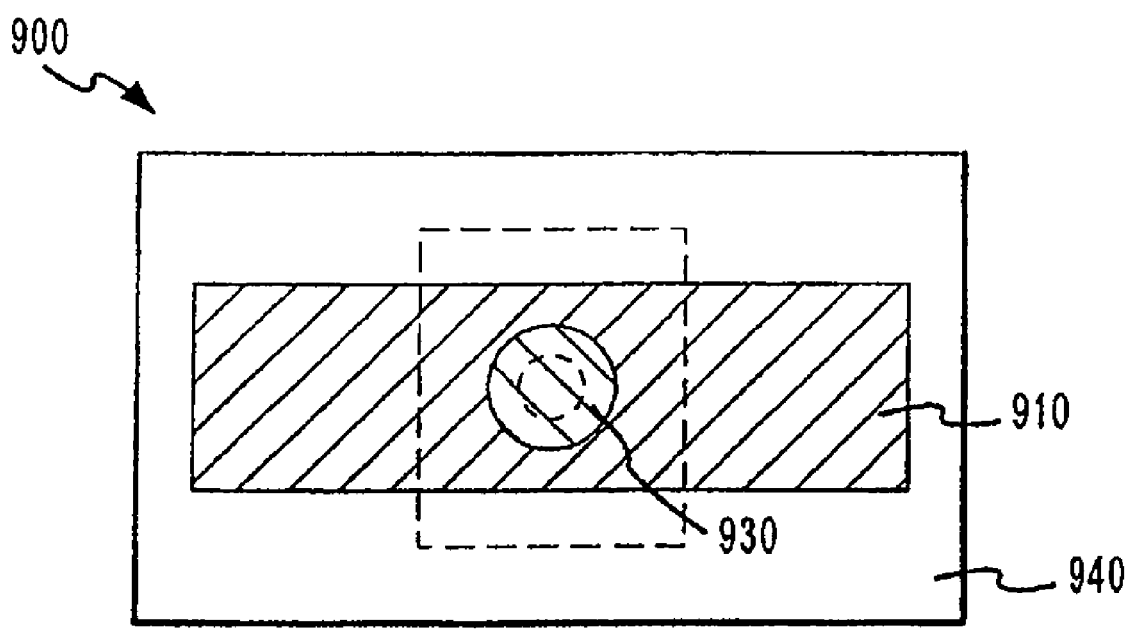

FIGS. 9 and 10 illustrate a programmable device 900 having an indifferent electrode 910, an oxidizable electrode 920, an ion conductor 930 and insulating layers 940 and 950 in accordance with yet another embodiment of the invention. Structure 900 is similar to structure 700, except that once a via is formed through layer 750, an isotropic etch process (e.g., chemical or plasma) is employed to form the via through electrode 910, such that a sloped intersection between an ion conductor 930 and electrode 910 is formed.

Figure 11:
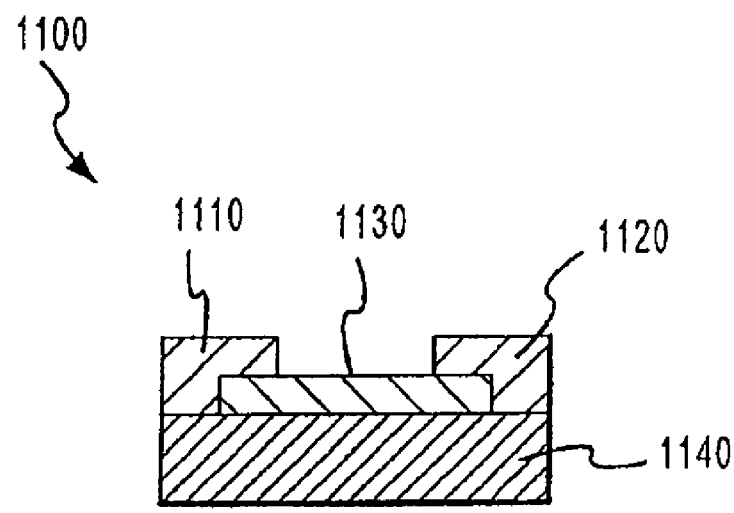
FIGS. 11 and 12 illustrate a programmable device having a horizontal configuration in accordance with the present invention.
Figure 12:
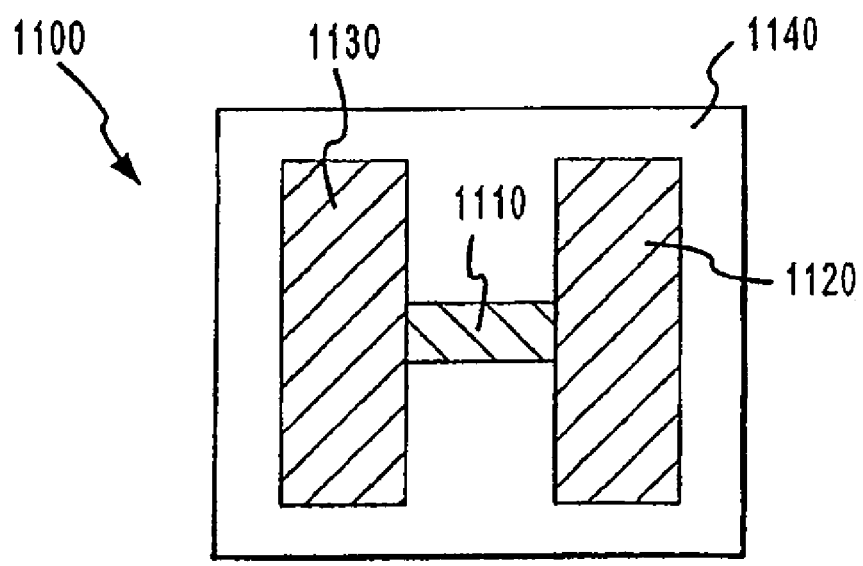
Figure 17:
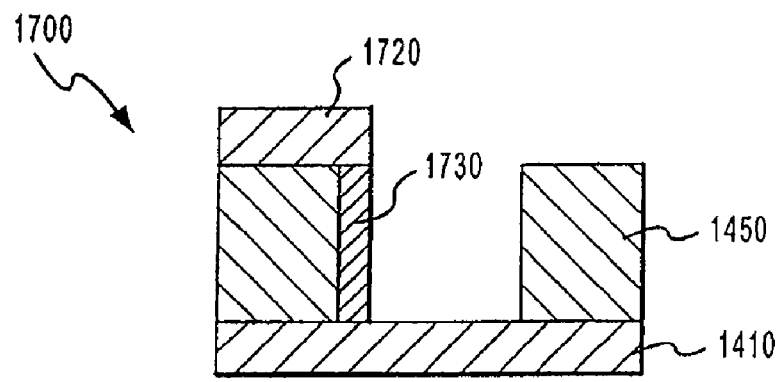

FIGS. 11 and 12 illustrate another programmable device 1100, with a reduced electrode/ion conductor interface, in accordance with the present invention. Structure 1100 includes electrodes 1110 and 1120 and an ion conductor 1130, formed on a surface of an insulating material 1140, rather than within a via as discussed above. In this case, the programmable structure is formed by defining an ion conductor 1130 pattern on a surface of insulating material 1140 (e.g., using deposition and etch techniques) and forming electrodes 1110 and 1120, such that the electrodes each contact a portion of the ion conductor. In the case of the illustrated embodiment, the electrodes are formed overlying and in contact with both a portion of the ion conductor and the insulating material. Although the thickness of the layers may be varied in accordance with specific applications of the device, in a preferred embodiment of the invention, the thickness of the ion conductor and electrode films is about 1 nm to about 100 nm. Sub-lithographic lateral dimensions of portions of the device may be obtained by overexposing photoresist used to pattern the portions and/or over etching the film layer.

FIG. 13 illustrates a device 1300 in accordance with yet another embodiment of the invention. Structure 1300 is similar to the devices illustrated in FIGS. 7 and 8, except that the cross-sectional area of the ion conductor that is in contact with the electrodes is reduced by filling a portion of a via with non-ion conductor material, rather than etching through an electrode layer.

Structure 1300 includes electrodes 1310 and 1320 and an ion conductor 1330 formed within an insulating layer 1340. In this case, ion conductor 1330 is formed by creating a trench within insulating layer 1340, the trench having a diameter indicated by D2. The trench is then filled using, for example, interference lithography techniques or conformally lining the via with insulating material and using an anisotropic etch process to remove some of the insulating material, leaving a via with a diameter of D3. Structure 1300 formed using this technique may have a ion conductor cross sectional area as small as about 10 nm in contact with electrodes 1310 and 1320.

FIGS. 14-17 illustrate another embodiment of the invention, where the cross sectional area of the ion conductor/ electrode interface is relatively small. Structure 1400, illustrated in FIG. 14, includes electrodes 1410 and 1420 and an ion conductor 1430. Structure 1400 is formed in a manner similar to structure 700, except that the ion conductor material is deposited conformally, using, for example chemical vapor deposition or physical vapor deposition, into a trench, and the trench is not filled with the ion conductor material.

Structure 1500 is similar to structure 1400, except that an ion conductor 1530 is formed by etching a portion of ion conductor 1430, such that a via 1540 is formed through to electrode 1410. Structure 1600 is similar to structure 1500 and is formed by conformally depositing the ion conductor material as described above and then removing the ion conductor material from a surface of insulating material 1450 prior to depositing electrode 1420 material. Finally, structure 1700 may be formed by selectively deposing the ion conductor 1730 material into only a portion of the trench formed in insulating material 1450 (e.g., using angled deposition and/or shadowing techniques), removing any excess ion conductor material on the surface of insulator 1450, and forming an electrode 1720 overlying the insulator and in contact with ion conductor 1730.

Figure 18:
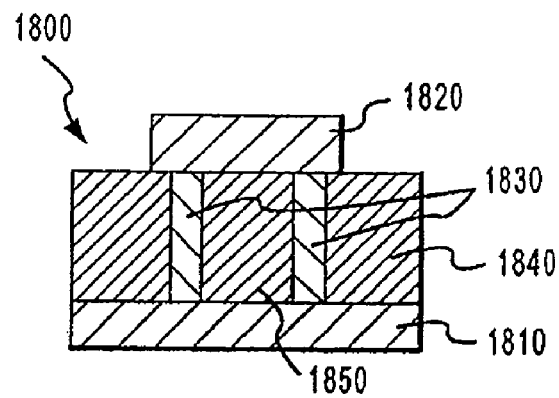
Figure 19:
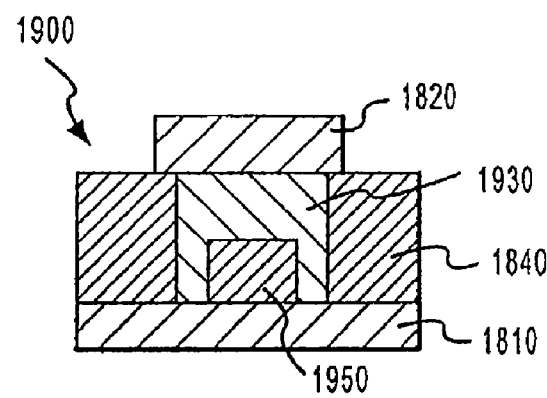

FIGS. 18 and 19 illustrate yet another embodiment of the invention, where a pillar or wall within a trench is used to reduce a cross-sectional area of the interface between the ion conductor and one or more electrodes. Structure 1800, illustrated in FIG. 18, includes electrodes 1810 and 1820 and an ion conductor 1830 formed within an insulating layer 1840.

In addition, structure 1800 includes a pillar 1850 of insulating material (e.g., insulating material used to form layer 1840), formed within a trench within layer 1840. Structure 1800 may be formed using the shadowed deposition technique discussed above. Structure 1900 is similar to structure 1800, except structure 1900 includes a partial pillar 1950 and an ion conductor 1930, which fills the remaining portion of the formed trench.

Figure 20:
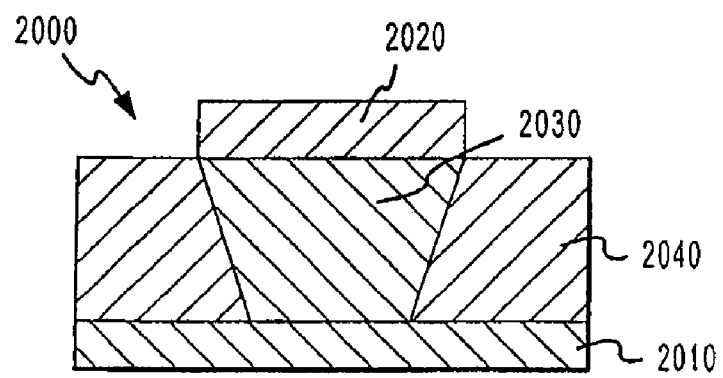
FIG. 20 illustrates a programmable device with a tapered ion conductor in accordance with the present invention.

FIG. 20 illustrates yet another structure 2000 in accordance with the present invention. Structure 2000 includes electrodes 2010 and 2020 and an ion conductor 2030 formed within an insulating layer 2040. Structure 2000 is formed using an anisotropic or a combination of an anisotropic and an isotropic etch processes to form a tapered via. Ion conductor 2030 is then formed within the trench using techniques previously described.

FIGS. 21-24 illustrate programmable devices in accordance with yet another embodiment of the invention. The structures illustrated in FIGS. 21-24 include a floating electrode, which allows multiple bits of information to be stored within a single programmable device.

Structure 2100 includes a first electrode 2110, a second, floating electrode 2120, a third electrode 2130, ion conductor portions 2140 and 2150, which may all be formed on a substrate or wholly or partially formed within a via as described above. Although structure 2100 is illustrated in a vertical configuration, the structure may be formed in a horizontal configuration, similar to structure 1100. In accordance with one aspect of this embodiment, the first and third electrodes are formed of an indifferent electrode and the second electrode is formed of an oxidizable electrode material. Alternatively, the first and third electrodes may be formed of oxidizable electrode material and the second, floating electrode may be formed of an indifferent electrode material. In either case, the structure includes two "half cells," where each half cell functions as a programmable device described above in connection with FIG. 1. Each half cell is preferably configured such that the resistance of one half cell differs from the resistance of the other half cell when both cells are in an erased state.

Figures 21, 22, 23, 24:
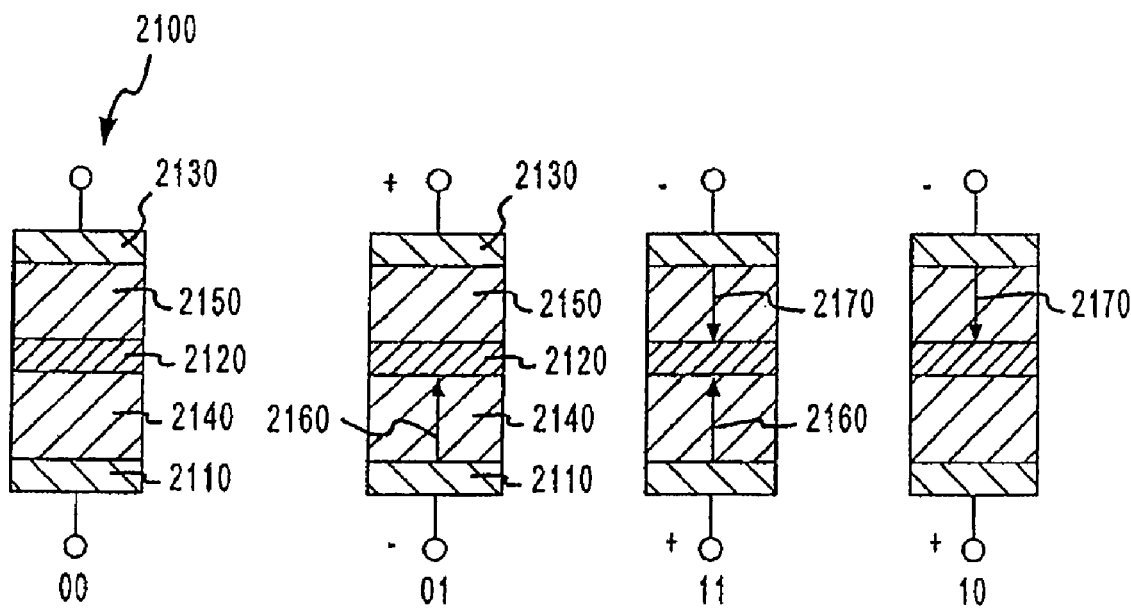
FIGS. 21-24 illustrate a programmable device including a floating electrode in accordance with the present invention.

In the case when floating electrode 2120 is formed of oxidizable electrode material, bits of data may be stored as follows. The overall impedance of structure 2100 is approximately equal to the resistance of portions 2140 and 2150. When no electrodeposit is formed within either portion, this high resistance state may be represent by the state 00. When a voltage is applied to structure 2100, such that electrode 2130 is positive relative to electrode 2110 and the applied bias is greater that the threshold voltage required to form an electrodeposit in portion 2140, an electrodeposit 2160 will form through conductor portion 2140 from electrode 2110 toward floating electrode 2120 as illustrated in FIG. 22. Under this condition, an electrodeposit will not form within conductor portion 2150 because portion 2150 is under a reverse bias condition and thus will not support growth of an electrodeposit. The growth of the electrodeposit will change the impedance of portion 2140 from $Z_1$ to $Z_1'$, thus changing the overall impedance of structure 2100, which may be represent by the state 01. The current level used to form electrodeposit 2160 should be selected such that it is sufficiently low, allowing the electrodeposit to be dissolved upon application of a sufficient reverse bias. A third state may be formed by reversing the polarity of the applied bias across electrodes 2110 and 2130, such that most of the voltage drop occurs across the high resistance ion conductor portion 2150 and formation of an electrodeposit 2170 begins, as illustrated in FIG. 23, without causing electrodeposit 2160 to dissolve. The impedance of portion 2150 changes from $Z_2$ to $Z_2'$, and the overall impedance of structure 2100 is $Z_1'$ plus $Z_2'$, which may be represented by the state 11. Once both half cells are in the write state, electrodeposit 2160 and/or 2170 may be dissolved by applying a sufficient bias across one or both of the half cells. Electrodeposit 2170 can be erased, for example, by sufficiently negatively biasing electrode 2130 with respect to electrode 2110, which may be represented by a state 00. The four possible states, along with the current limit used to form the state, are represented in table 1 below.

TABLE 1

| Seq # | Polarity | Current limit | Z half-cell 1 | Z half-cell 2 | State/value |
|---|---|---|---|---|---|
| 1 | Sub-threshold | Zero | Z1 | Z2 | 00 |
| 2 | Upper + Lower − | Low | Z1' | Z2 | 01 |
| 3 | Upper − Lower + | Low | Z1' | Z2' | 11 |
| 4 | Upper − Lower + | High | Z1 | Z2' | 10 |

Structure 2100 can be changed to 11 from state 10 by applying a low current limit bias to grow electrodeposit 2150 in portion 2140. Similarly, structure 2100 can be changed from state 11 to state 01 by dissolving electrodeposit 2170 by applying a relatively high current limit bias such that upper electrode 2130 is positive with respect to lower electrode 2110. Finally, structure 2100 can be returned to state 00 using a short current pulse to thermally dissolve electrodeposit 2160, using a current which is high enough to cause localized heating of the electrodeposit. This will increase the metal concentration in the half-cell but this excess metal can be removed electrically from the cell by plating it back onto the floating electrode. This sequence is summarized in table 2 below.

TABLE 2

| Seq # | Polarity | Current limit | Z half-cell 1 | Z half-cell 2 | State/value |
|---|---|---|---|---|---|
| 4 | Existing state | — | Z1 | Z2' | 10 |
| 5 | Upper + Lower − | Low | Z1' | Z2' | 11 |
| 6 | Upper + Lower − | High | Z1' | Z2 | 01 |
| 7 | Upper + Lower − | Thermal | Z1 | Z2 | 00 |

Other write and erase sequences are also possible (as are other definitions of the various states represented by the half-cell impedances). For example, it is possible to go from state 00 to either state 01 or state 10, depending on the write polarity chosen. Similarly, it is possible to go from state 11 to either state 10 or state 01. It is also possible to go from state 11 to state 00 by the application of a current pulse (in either direction) which is high and short enough to thermally dissolve the electrodeposits in both half-cells simultaneously.

In addition to storing information in digital form, structure 2100 can also be used as a noise-tolerant, low energy anti-fuse element for use in field programmable gate arrays (FPGAs) and field configurable circuits and systems. Most physical anti-fuse technologies require large currents and voltages to make a permanent connection. The need for such high energy state-switching stimuli is generally considered to be somewhat beneficial as this reduces the likelihood of the anti-fuse accidentally forming a connection in electrically noisy situations. However, the use of high voltages and large currents on chip represent a significant problem as all components in the programming circuits are typically sized accordingly and the high energy consumption reduces battery life in portable systems.

FIGS. 25-29 illustrate structures in accordance with another embodiment of the invention in which multiple programmable devices include a common electrode (e.g., the devices share a common anode or cathode). Forming structures in which multiple structures share a common electrode is advantageous because such structures allow a higher density of cells to be formed on a given substrate surface area.

Figure 25:
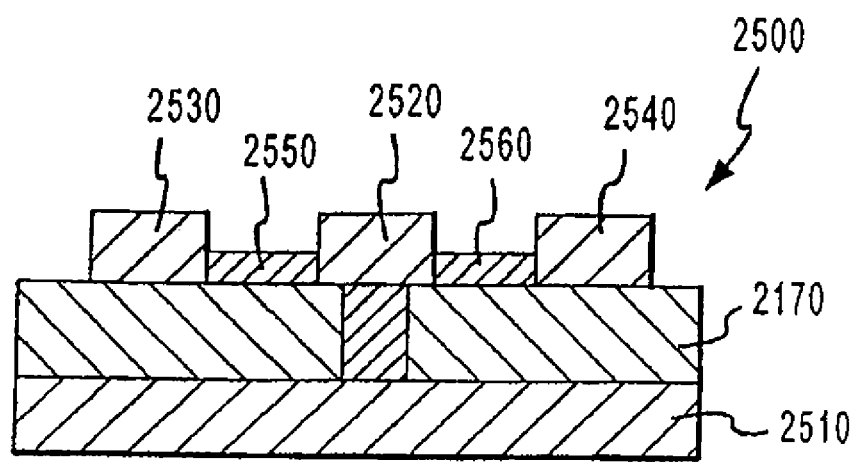
FIGS. 25-29 illustrate common electrode programmable device structures in accordance with the present invention.
Figure 26:
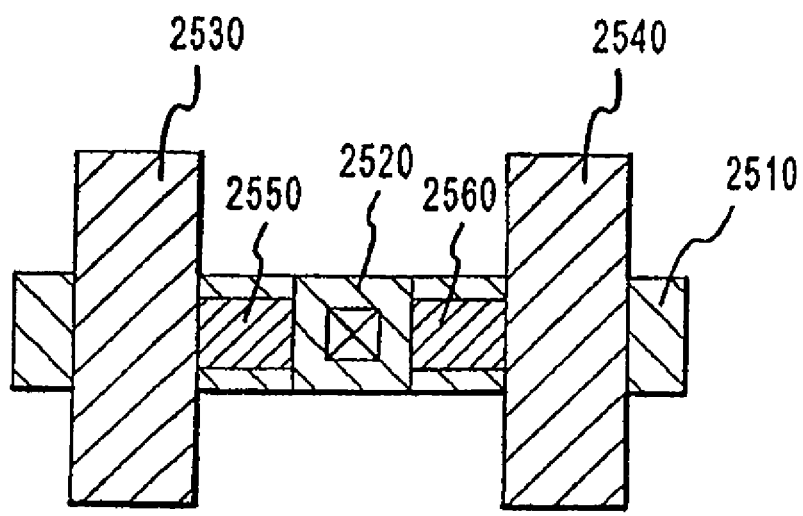

FIGS. 25 and 26 illustrate a structure 2500, having a horizontal configuration and a common electrode. Structure 2500 includes an electrical connector 2510 coupled to a common surface electrode 2520, electrodes 2530 and 2540, and ion conductor portions 2550 and 2560 overlying an insulating layer 2170. Structure 2500 may be used to form word and bit lines as described above by forming a row of electrodes (e.g., anodes) coupled to conductor 2510, and columns of oppositely bias electrodes (e.g., cathodes) running perpendicular to electrodes 2520. A conductive plug, formed of any suitably conducting material can be used to electrically couple electrode 2520 to conductor 2510. Although illustrated with a horizontal configuration, common electrode structures in accordance with this embodiment may be formed using structures having a vertical configuration as described herein.

Figure 27:
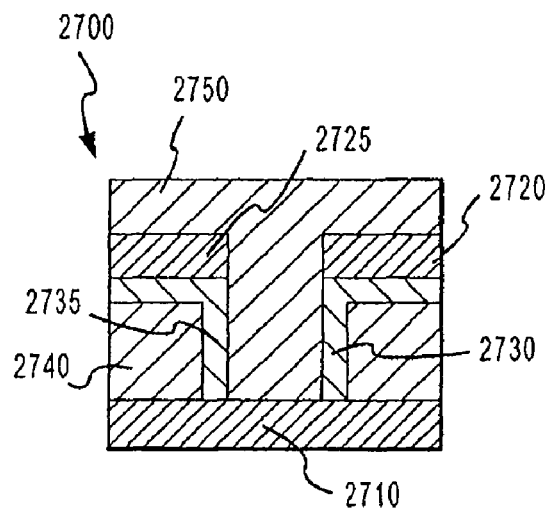
Figure 28:
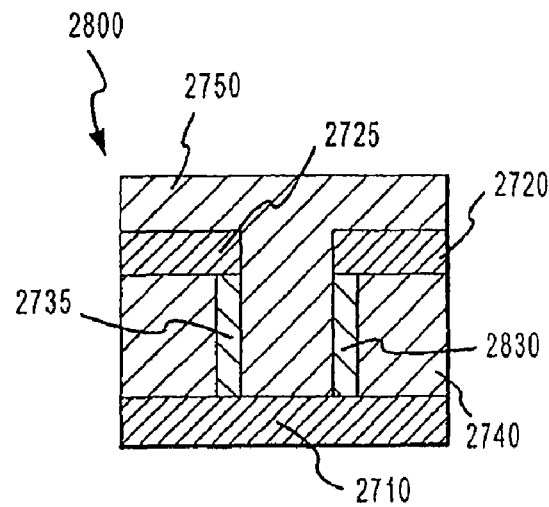

FIGS. 27 and 28 illustrate additional structures 2700 and 2800 having a common electrode shared between two or more devices Structures 2700 and 2800 include a common electrode, electrodes 2720 and 2725, ion conductors 2730,2735 and 2830, 2835 respectively, and insulating layers 2740 and 2750. Structures 2700 and 2800 may be formed using techniques described above in connection with FIGS. 15 and 16—e.g., by conformally depositing ion conductor material within a trench of an insulating layer. In accordance with another embodiment of the invention, directional deposition may be used to form a structure similar to structure 1700. Structures 2700 and 2800 each include two programmable devices including common electrode 2710 an ion conductor (e.g., conductor 2735) and another electrode (e.g., electrode 2725). Dielectric material 2750 is an insulating material that does not interfere with surface electrodeposit growth, such as silicon oxides, silicon nitrides, and the like.

Figure 29:
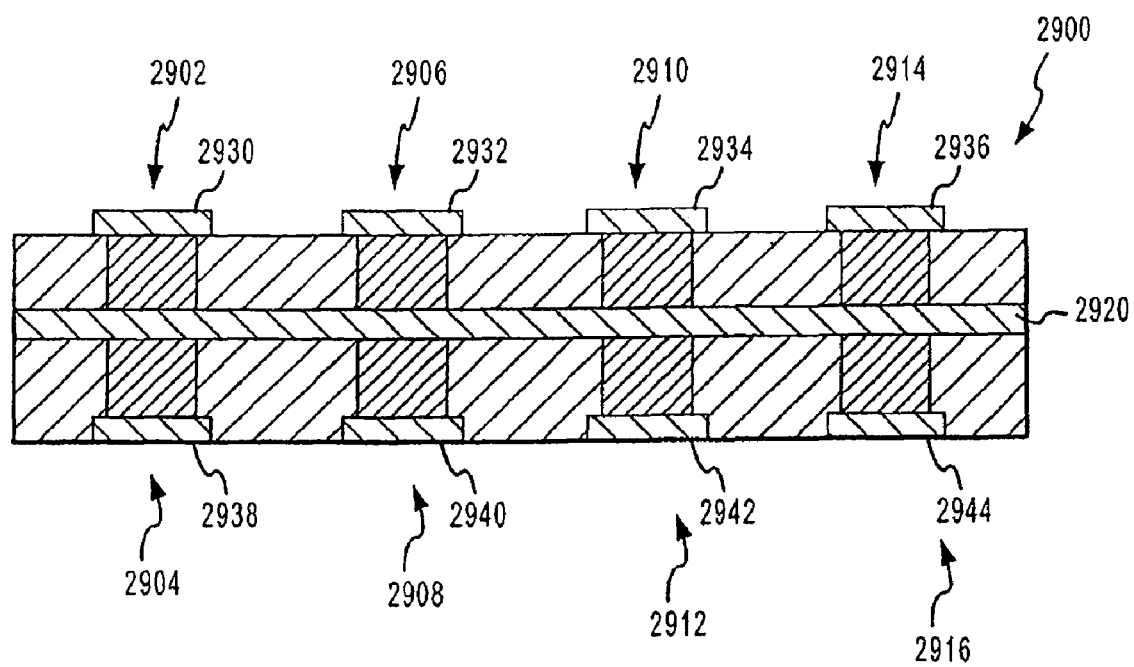

FIG. 29 illustrates a structure 2900 including multiple programmable devices 2902-2916 formed about a common electrode 2920. Each of the devices 2902-2916 may be formed using the method described above in connection with FIG. 21. In the embodiment illustrated in FIG. 29, each of electrodes 2930-2936 and 2938-2944 may be coupled together in a direction perpendicular to the direction of common electrode 2920, such that electrode 2920 forms a bit line and electrodes 2930-2936 and electrodes 2938-2944 form word lines. Structure 2900 may operate and be programmed in a manner similar to structure 2100 described above.

In accordance with other embodiments of the present invention, a programmable structure or device stores information by storing a charge as opposed to growing an electrodeposit. A capacitance of a structure or device is altered by applying a bias across electrodes of the device such that positively charged ions migrate toward one of the electrodes. If the applied bias is less that a write threshold voltage, no short will form between the electrodes. Capacitance of the structure changes as a result of the ion migration. When the applied bias is removed, the metal ions tend to diffuse away from the electrode or a barrier proximate the electrode. However, an interface between an ion conductor and a barrier is generally imperfect and includes defects capable of trapping ions. Thus, at least a portion of ions remain at or proximate an interface between a barrier and an ion conductor. If a write voltage is reversed, the ions may suitably be dispersed away from the interface.

A programmable structure in accordance with the present invention may be used in many applications which would otherwise utilize traditional technologies such as EEPROM, FLASH or DRAM. Advantages provided by the present invention over present memory techniques include, among other things, lower production cost and the ability to use flexible fabrication techniques which are easily adaptable to a variety of applications. The programmable structures of the present invention are especially advantageous in applications where cost is the primary concern, such as smart cards and electronic inventory tags. Also, an ability to form the memory directly on a plastic card is a major advantage in these applications as this is generally not possible with other forms of semiconductor memories.

Further, in accordance with the programmable structures of the present invention, memory elements may be scaled to less than a few square microns in size, the active portion of the device being less than on micron. This provides a significant advantage over traditional semiconductor technologies in which each device and its associated interconnect can take up several tens of square microns.

Additionally, the devices of the present invention require relatively low energy and do not require "refreshing." Thus, the devices are well suitable for portable device applications.

Although the present invention is set forth herein in the context of the appended drawing figures, it should be appreciated that the invention is not limited to the specific form shown. For example, while the programmable structure is conveniently described above in connection with programmable memory devices, the invention is not so limited; the structure of the present invention may suitably be employed as programmable active or passive devices within a microelectronic circuit. Furthermore, although only some of the devices are illustrated as including buffer, barrier, or transistor components, any of these components may be added to the devices of the present invention. Various other modifications, variations, and enhancements in the design and arrangement of the method and apparatus set forth herein, may be made without departing from the spirit and scope of the present invention as set forth in the appended claims.

The invention claimed is:

1. A microelectronic programmable structure comprising:
   a substrate including an insulating layer;
   a first electrode formed overlying the substrate;
   an ion conductor proximate the first electrode; and
   a second electrode,
   wherein information is written to the microelectronic programmable structure by applying a write bias greater to or equal to a threshold voltage across the first electrode and the second electrode to cause ions within the ion conductor to migrate to cause a change in an electrical property of the microelectronic programmable structure.

2. The microelectronic programmable structure of claim 1, wherein the ion conductor comprises a material selected from the group consisting of glass and semiconductor material.

3. The microelectronic programmable structure of claim 2, wherein the ion conductor comprises chalcogenide material.

4. The microelectronic programmable structure of claim 1, wherein the structure further comprises a conductive region formed within the ion conductor, wherein the conductive region has a lower resistance compared to the ion conductor.

5. The microelectronic programmable structure of claim 1, further comprising a buffer layer adjacent the ion conductor.

6. The microelectronic programmable structure of claim 5, wherein the buffer layer restricts migration of ions between the ion conductor and at least one of the first electrode and the second electrode.

7. The microelectronic programmable structure of claim 1, further comprising an insulating material selected from the group consisting of silicon nitride, silicon oxynitride, polymeric materials, and combinations thereof, wherein at least a portion of at least one of the first electrode, the ion conductor, and the second electrode are formed within a portion of the insulating material.

8. The microelectronic programmable structure of claim 1, wherein multiple bits of data are stored within the structure.

9. The microelectronic programmable structure of claim 1, wherein information is stored in the structure in analog form.

10. The microelectronic programmable structure of claim 1, wherein at least one of the first electrode and the second electrode is a floating electrode.

11. The microelectronic programmable structure of claim 1, wherein at least one of the first electrode and the second electrode is a common electrode.

12. The microelectronic programmable structure of claim 1, further comprising an isolation device coupled to one of the first electrode and the second electrode.

13. The microelectronic programmable structure of claim 12, wherein the isolation device is a diode.

14. A device comprising:
the microelectronic programmable structure of claim 1; and
a substrate underlying the microelectronic programmable structure.

15. The device of claim 14, further comprising a microelectronic device formed on the substrate.

16. A use of flexible fabrication techniques in the manufacture of a device including the microelectronic programmable structure of claim 1.

17. A method of programming the microelectronic programmable structure of claim 1, comprising the step of applying a pulse voltage across the first electrode and the second electrode, the voltage greater than or equal to a threshold voltage.

18. The method of programming the microelectronic programmable structure of claim 17, further comprising a read operation, wherein substantially zero Faradaic current flows during the read operation.

19. The method of programming the microelectronic programmable structure of claim 17, further comprising a read operation, wherein a first current is applied to the microelectronic programmable structure during the step of applying and a second current is applied during the read operation, wherein the second current is less than the first current.

20. The method of programming the microelectronic programmable structure of claim 17, comprising the step of writing a plurality of bits of data in the microelectronic programmable structure.

21. A microelectronic programmable structure comprising:
a first electrode;
an insulating layer overlying the first electrode;
an ion conductor proximate the first electrode, wherein at least a portion of the ion conductor is formed within a via in the insulating layer and wherein the at least a portion of the via is filled with non-ion conductor material; and
a second electrode.

* * * * *